(12) United States Patent
Kanzaki

(10) Patent No.: US 7,656,201 B2
(45) Date of Patent: Feb. 2, 2010

(54) OUTPUT BUFFER CIRCUIT

(75) Inventor: Teruaki Kanzaki, Tokyo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 155 days.

(21) Appl. No.: 11/516,594

(22) Filed: Sep. 7, 2006

(65) Prior Publication Data
US 2007/0057705 A1    Mar. 15, 2007

(30) Foreign Application Priority Data
Sep. 15, 2005    (JP) .............................. 2005-267936

(51) Int. Cl.
*H03K 3/00*    (2006.01)
(52) U.S. Cl. ...................................... 327/108; 327/111
(58) Field of Classification Search ........................ None
See application file for complete search history.

(56) References Cited

U.S. PATENT DOCUMENTS

| | | | | |
|---|---|---|---|---|
| 5,317,206 A * | 5/1994 | Hanibuchi et al. | ............. | 326/21 |
| 5,537,067 A * | 7/1996 | Carvajal et al. | ............. | 327/108 |
| 6,236,239 B1 * | 5/2001 | Kogushi | ..................... | 326/88 |
| 6,850,100 B2 * | 2/2005 | Takeshita | ..................... | 327/112 |
| 6,903,588 B2 * | 6/2005 | Vorenkamp | .................. | 327/170 |
| 7,126,388 B2 * | 10/2006 | Harriman | ..................... | 327/108 |
| 7,126,389 B1 * | 10/2006 | McRae et al. | ................ | 327/112 |
| 7,224,195 B2 * | 5/2007 | Pilling et al. | ................. | 327/112 |
| 7,282,075 B2 * | 10/2007 | Sporre et al. | .................. | 55/302 |
| 2005/0122146 A1 * | 6/2005 | Lin | ............................ | 327/170 |
| 2006/0158232 A1 * | 7/2006 | Lenz | .......................... | 327/112 |
| 2007/0205814 A1 * | 9/2007 | Chatal et al. | ................. | 327/112 |

FOREIGN PATENT DOCUMENTS

JP        2001-508635        6/2001

* cited by examiner

*Primary Examiner*—Tuan Lam
*Assistant Examiner*—Hiep Nguyen
(74) *Attorney, Agent, or Firm*—Buchanan Ingersoll & Rooney PC

(57) ABSTRACT

When a first signal is switched from an L level to an H level and a second signal is switched from an H level to an L level, and a first constant current source cannot follow the switching immediately thereafter and has not yet been switched, a first node remains at an H level, so an output node remains at an L level. In such state, a second node having been connected to a third node of an H level before the switching becomes connected to the first node of an H level by the switching. At the same time, the output part of an inverter is switched from an H level to an L level, causing the second node to be switched from an H level to an L level as well via a capacitor. At this time, the potential of the first node is reduced to become equal to the second node, to make a transition to an L level.

6 Claims, 12 Drawing Sheets

F I G . 3
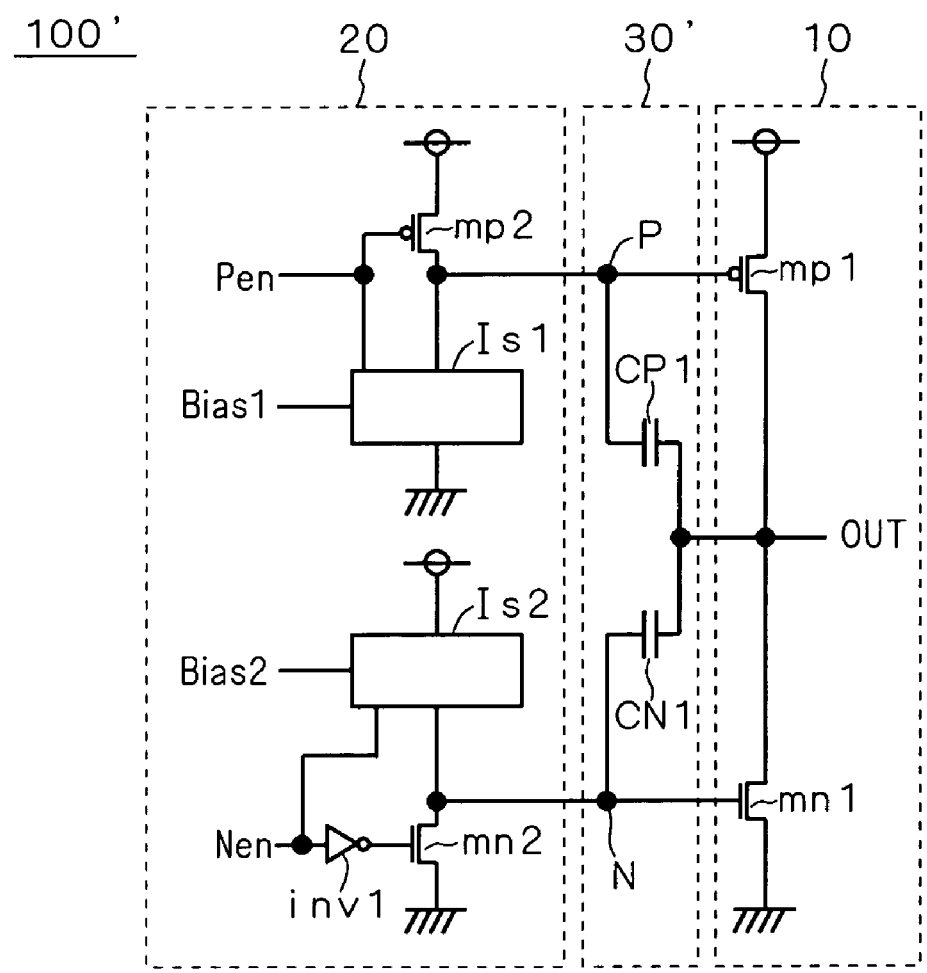

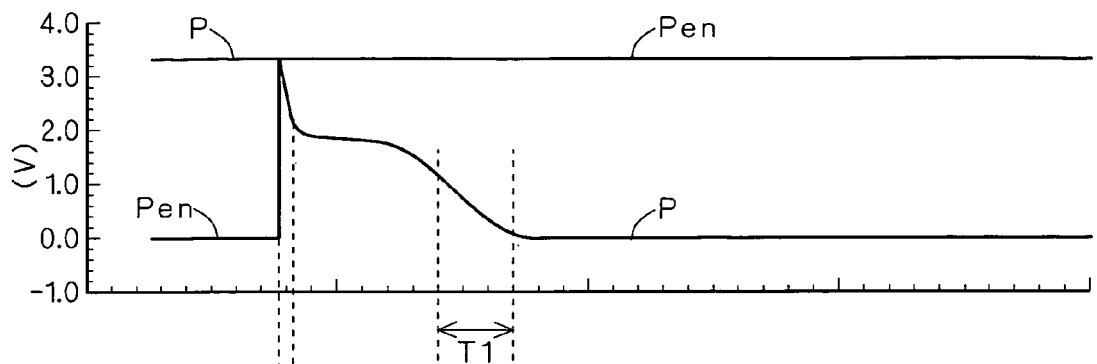
F I G. 5A
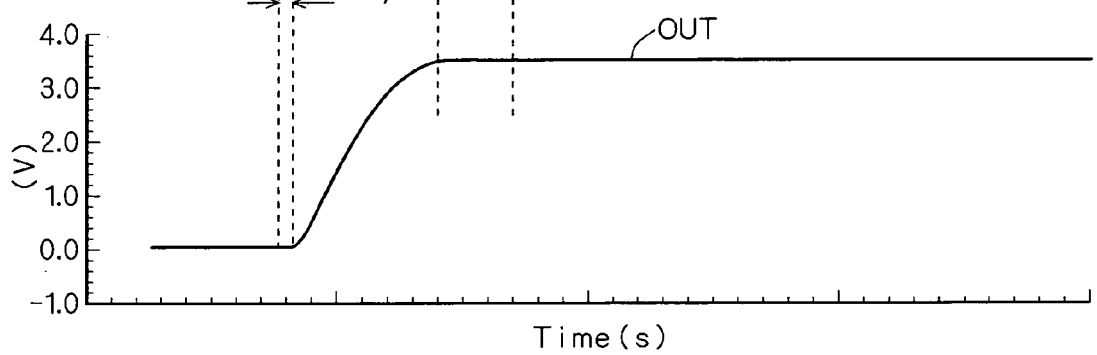
F I G. 5B
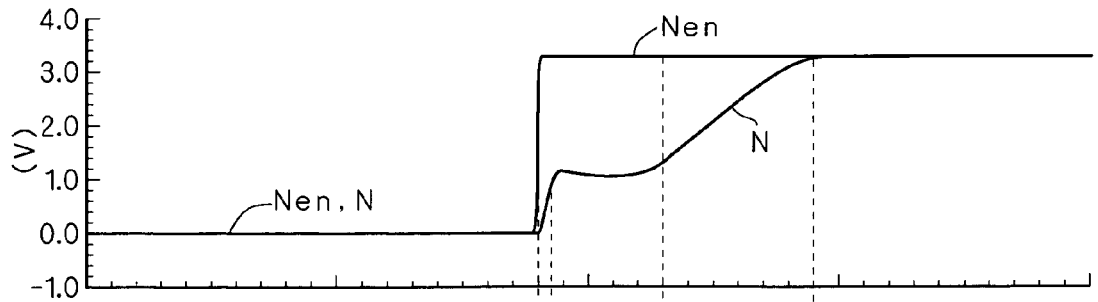
F I G. 5C
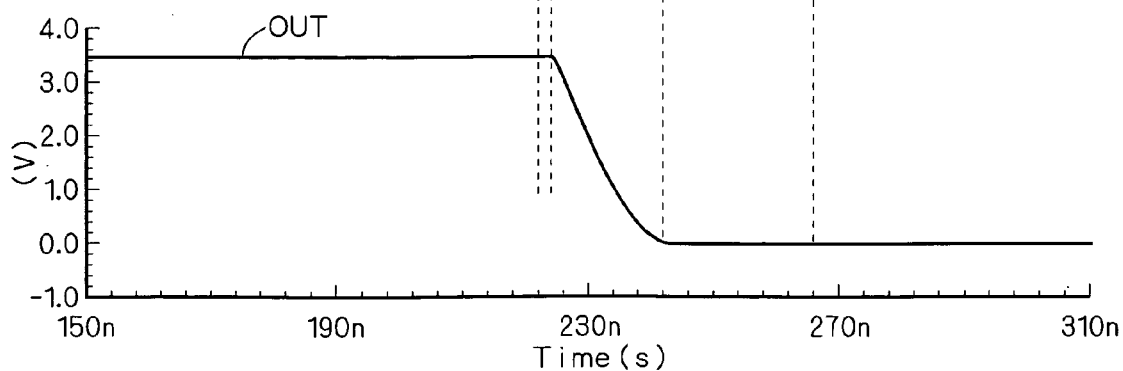
F I G. 5D F I G . 6
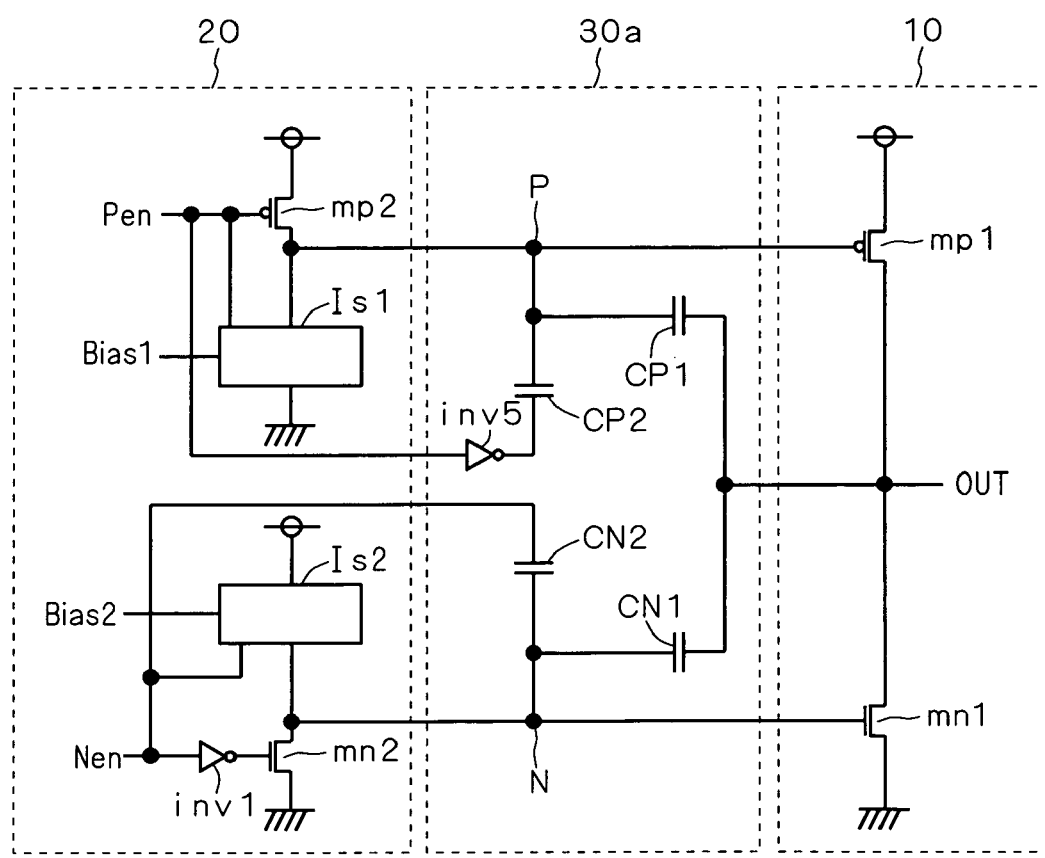

F I G . 7
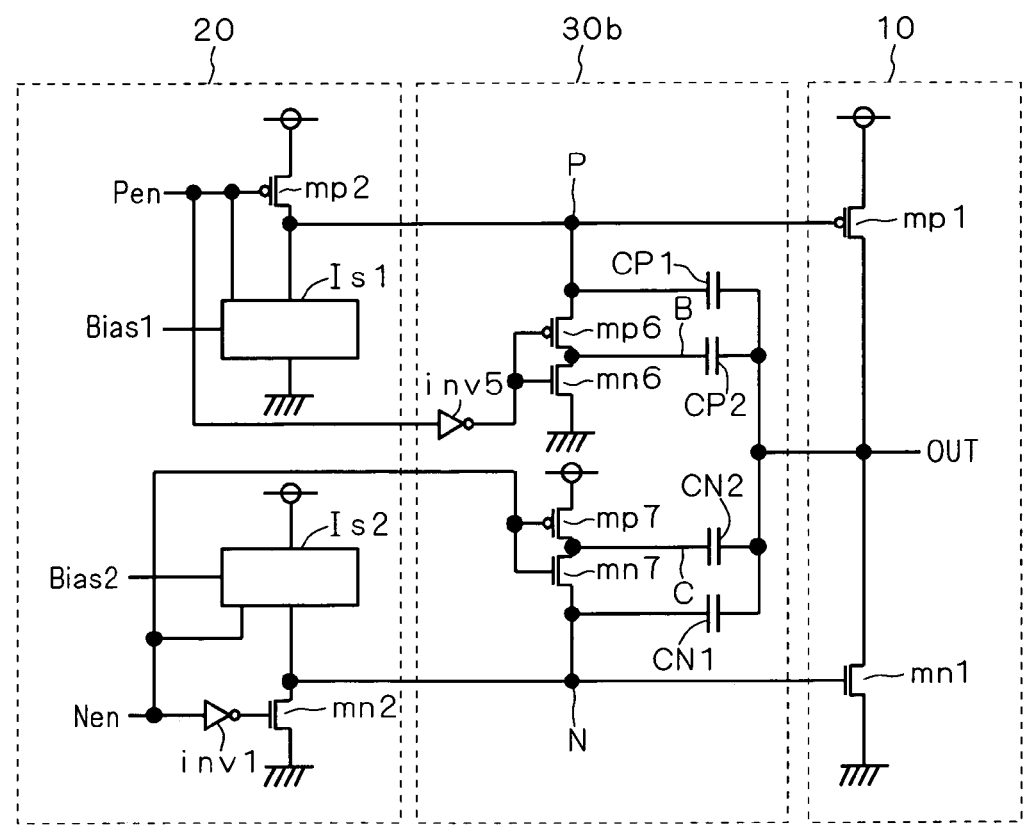

10b

OUTPUT BUFFER CIRCUIT

BACKGROUND OF THE INVENTION

1. Field of the Invention

The present invention relates to output buffer circuits and, more specifically, to techniques for reducing an output delay in slew-rate controlled output buffer circuits.

2. Description of the Background Art

Conventionally, an output buffer circuit includes a driver circuit that outputs a driver signal from an output node between a PMOS transistor for output and an NMOS transistor for output, a driver control circuit that controls the gates of the PMOS transistor for output and the NMOS transistor for output based on a supplied control signal, and a capacitor circuit that is interposed between the driver circuit and the driver control circuit, and controls a slew rate by using a capacitor.

The slew rate of an output buffer circuit is defined by such standards as ATA/ATAPI, and strobe signal and data having a period of 30 nanoseconds are defined by such protocols as UltraDMA-mode 6. For this reason, there has been a demand for an output buffer circuit having an accurately controlled slew rate with little delay.

In conventional output buffer circuits, the driver signal output from the output node between the PMOS transistor for output and the NMOS transistor for output is returned to the gates of the PMOS transistor for output and the NMOS transistor for output via the capacitor, to thereby set a prescribed slew rate.

In the conventional output buffer circuits, however, the gates of the PMOS transistor for output and the NMOS transistor for output are controlled only via a constant current source that is included in the driver control circuit. The operation of the constant current source therefore takes time, sometimes causing an increase in delay.

National Publication of Translation No. 2001-508635 discloses, as shown in FIG. 6, reducing a delay by connecting a capacitor CF returned from an output node $v_o$ alternately to the gate of a PMOS transistor P1 for output and the gate of an NMOS transistor N1 for output.

In National Publication of Translation No. 2001-508635, the capacitor CF to be connected to the gates is expected to have a potential of (gate potential of the NMOS transistor N1 for output (power supply potential)−NMOS threshold voltage Vthn) prior to being connected to the gate of the PMOS transistor P1 for output. But when a control signal input to an input node $v_i$ remains at an L level for a long time due to an intermission and the like, the potential of the capacitor CF does not become the (gate potential of the NMOS transistor N1 for output (power supply potential)−NMOS threshold voltage Vthn) due to leakage of the transistors and the like. Namely, the potential of the capacitor CF becomes a gate potential of the NMOS transistor N1 for output (power supply potential), resulting in little delay reduction.

Likewise, in National Publication of Translation No. 2001-508635, the capacitor CF to be connected to the gates is expected to have a potential of (gate potential of the PMOS transistor P1 for output (ground potential)+PMOS threshold voltage Vthp) prior to being connected to the gate of the NMOS transistor N1 for output. But when a control signal input to the input node $v_i$ remains at an H level for a long time due to an intermission and the like, the potential of the capacitor CF becomes the gate potential of the PMOS transistor P1 for output (ground potential) due to leakage of the transistors and the like, resulting in little delay reduction. In addition, the signals having a long "L" period and a long "H" period input to the input node $v_i$ cause a change in output delay.

SUMMARY OF THE INVENTION

The present invention has an object to provide an output buffer circuit capable of reducing an output delay.

In a first aspect of the present invention, an output buffer circuit includes a driver circuit, a driver control circuit, and a capacitor circuit. The driver circuit includes a first transistor and a second transistor for outputting a driver signal to an output node, the first and second transistors being connected in series via the output node. The driver control circuit controls the first and second transistors based on a control signal. The capacitor circuit includes a group of capacitors interposed between the output node and control electrodes of the first and second transistors, for performing slew rate control on the driver signal. The group of capacitors includes a main capacitor and an auxiliary capacitor. The main capacitor is connected to the output node. The auxiliary capacitor is connected to the main capacitor, for changing a potential of a connection node of the main capacitor to the control electrodes of the first and second transistors by a change in applied voltage in accordance with the control signal.

A switching speed of the driver signal can be increased, thereby reducing an output delay.

In a second aspect of the present invention, an output buffer circuit includes a driver circuit, a driver control circuit, and a capacitor circuit. The driver circuit includes a first transistor and a second transistor for outputting a driver signal to an output node, the first and second transistors being connected in series via the output node. The driver control circuit controls the first and second transistors based on a control signal. The capacitor circuit includes a group of capacitors interposed between the output node and control electrodes of the first and second transistors, for performing slew rate control on the driver signal. The control signal includes a first control signal and a second control signal. The first control signal controls the first transistor, and the second control signal controls the second transistor. The driver control circuit includes a first fixing circuit and a second fixing circuit. The first fixing circuit operates in such a way as to fix the driver signal in accordance with the first control signal when the driver signal is in a stable state. The second fixing circuit operates in such a way as to fix the driver signal in accordance with the second control signal when the driver signal is in a stable state.

An unnecessary current can be reduced.

In a third aspect of the present invention, an output buffer circuit includes a driver circuit, a driver control circuit, and a capacitor circuit. The driver circuit includes a first transistor and a second transistor for outputting a driver signal to an output node, the first and second transistors being connected in series via the output node. The driver control circuit controls the first and second transistors based on a control signal. The capacitor circuit includes a group of capacitors interposed between the output node and control electrodes of the first and second transistors, for performing slew rate control on the driver signal. The driver circuit includes a potential control circuit for supplying the control electrode of the first transistor with a potential equal to the driver signal when the driver signal becomes greater than a second power supply potential.

The first and second transistors can be cut off positively even when a signal having a potential higher than the second power supply potential is input from the output node.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 shows a circuit diagram for comparison purposes of the structure of an output buffer circuit;

FIGS. 4A to 4E and FIGS. 5A to 5D shows timing charts of simulation waveforms of potentials of the respective signals and nodes in the output buffer circuit according to the first preferred embodiment;

FIG. 6 shows a circuit diagram of the structure of an output buffer circuit according to a second preferred embodiment;

FIG. 7 shows a circuit diagram of the structure of an output buffer circuit according to a third preferred embodiment;

DESCRIPTION OF THE PREFERRED EMBODIMENTS

First Preferred Embodiment

Figure 1:
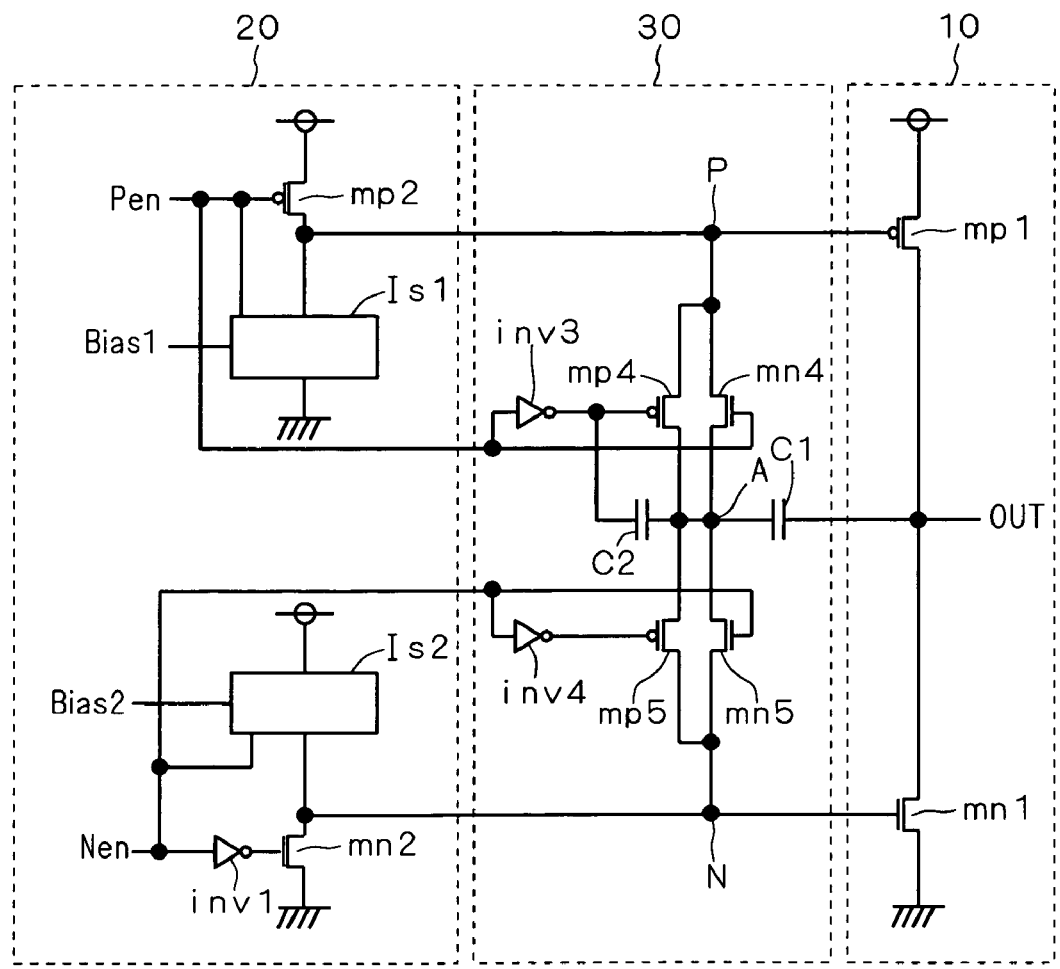
FIG. 1 shows a circuit diagram of the structure of an output buffer circuit according to a first preferred embodiment.
Figure 2:
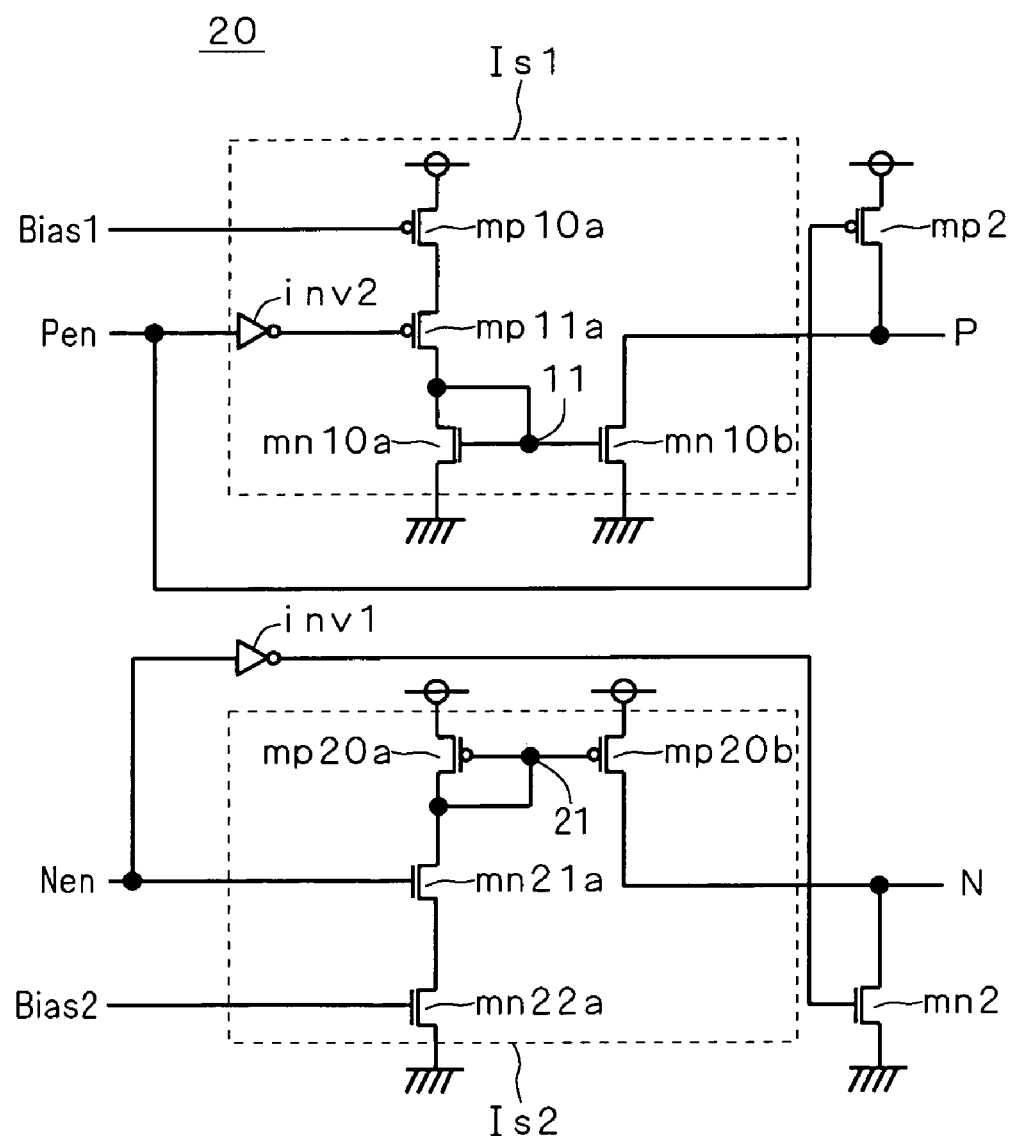
FIG. 2 shows a circuit diagram of the structure of a driver control circuit according to the first preferred embodiment.
Figure 4A:
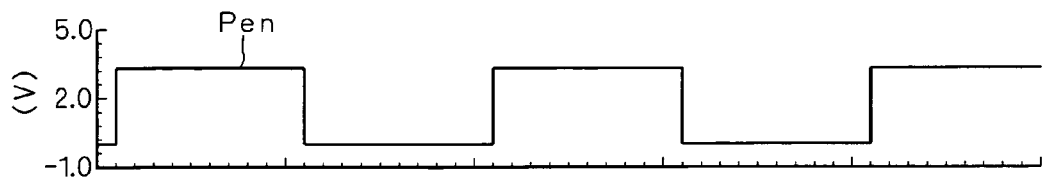
Figure 4B:
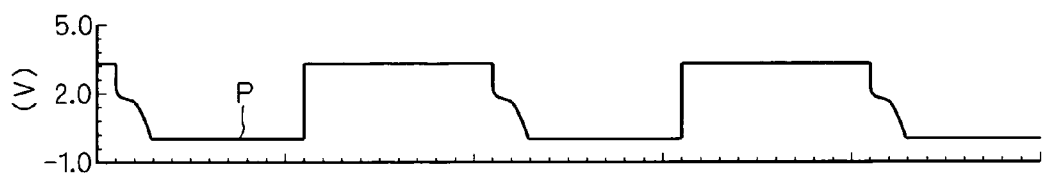
Figure 4C:
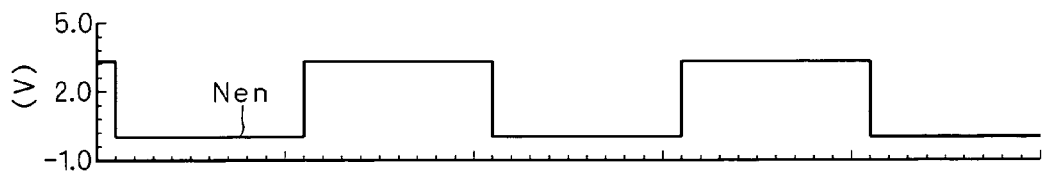
Figure 4D:
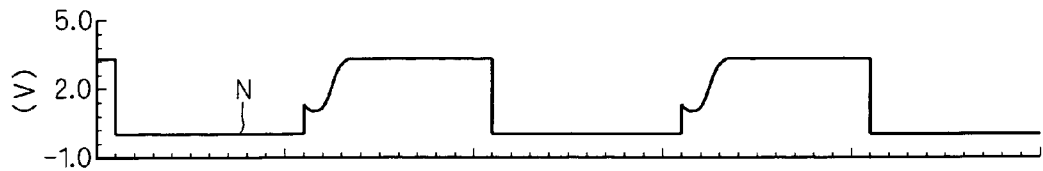
Figure 4E:
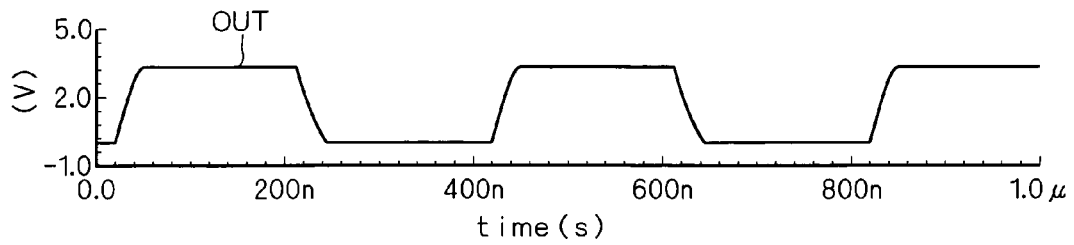

FIG. 1 shows a circuit diagram of the structure of a slew-rate controlled output buffer circuit 100 according to a first preferred embodiment. As shown, the output buffer circuit 100 includes a driver circuit 10, a driver control circuit 20 for controlling the driver circuit 10, and a capacitor circuit 30 interposed between the driver circuit 10 and the driver control circuit 20 for controlling a slew rate. FIG. 2 shows a circuit diagram of a detailed structure of the driver control circuit 20 shown in FIG. 1.

As shown in FIG. 1, the driver circuit 10 includes a PMOS transistor mp1 and an NMOS transistor mn1. The driver control circuit 20 includes constant current sources Is1 and Is2, a PMOS transistor mp2, an NMOS transistor mn2, and an inverter inv1. The capacitor circuit 30 includes capacitors C1 and C2, inverters inv3 and inv4, PMOS transistors mp4 and mp5, and NMOS transistors mn4 and mn5.

As shown in FIG. 2, the constant current source Is1 includes PMOS transistors mp10a and mp11a, NMOS transistors mn10a and mn10b, and an inverter inv2. The constant current source Is2 includes PMOS transistors mp20a and mp20b, and NMOS transistors mn21a and mn22a.

In FIG. 1, the source of the PMOS transistor mp1 is connected to a power supply potential (second power supply potential). The drain of the PMOS transistor mp1 is connected at a node OUT to the drain of the NMOS transistor mn1 and one end of the capacitor C1. The source of the NMOS transistor mn1 is connected to ground potential (first power supply potential).

The source of the PMOS transistor mp2 is connected to the power supply potential. The drain of the PMOS transistor mp2 is connected at a node P to the constant current source Is1 (the drain of the NMOS transistor mn10b), the capacitor circuit 30 (the source of the PMOS transistor mp4 and the drain of the NMOS transistor mn4), and the gate of the PMOS transistor mp1.

A signal Pen is input to the gate of the PMOS transistor mp2, the constant current source Is1 (the input part of the inverter inv2), and the capacitor circuit 30 (the input part of the inverter inv3 and the gate of the NMOS transistor mn4).

A signal Bias1 is input to the constant current source Is1 (the gate of the PMOS transistor mp10a).

The source of the NMOS transistor mn2 is connected to the ground potential. The drain of the NMOS transistor mn2 is connected at a node N to the constant current source Is2 (the drain of the PMOS transistor mp20b), the capacitor circuit 30 (the drain of the PMOS transistor mp5 and the source of the NMOS transistor mn5), and the gate of the NMOS transistor mn1.

A signal Nen is input to the input part of the inverter inv1, the constant current source Is2 (the gate of the NMOS transistor mn21a), and the capacitor circuit 30 (the input part of the inverter inv4 and the gate of the NMOS transistor mn5). The output part of the inverter inv1 is connected to the gate of the NMOS transistor mn2.

A signal Bias2 is input to the constant current source Is2 (the gate of the NMOS transistor mn22a).

The other end of the capacitor C1 is connected at a node A to one end of the capacitor C2, the drain of the PMOS transistor mp4, the source of the PMOS transistor mp5, the source of the NMOS transistor mn4, and the drain of the NMOS transistor mn5. The other end of the capacitor C2 is connected to the output part of the inverter inv3 and the gate of the PMOS transistor mp4. The output part of the inverter inv4 is connected to the gate of the PMOS transistor mp5.

In FIG. 2, the source of the PMOS transistor mp10a is connected to the power supply potential. The drain of the PMOS transistor mp10a is connected to the source of the PMOS transistor mp11a. The gate of the PMOS transistor mp11a is connected to the output part of the inverter inv2. The drain of the PMOS transistor mp11a is connected at a node 11 to the drain and the gate of the NMOS transistor mn10a, and the gate of the NMOS transistor mn10b. The sources of the NMOS transistors mn10a and mn10b are connected to the ground potential.

The source of the NMOS transistor mn22a is connected to the ground potential. The drain of the NMOS transistor mn22a is connected to the source of the NMOS transistor mn21a. The drain of the NMOS transistor mn21a is connected at a node 21 to the drain and the gate of the PMOS transistor mp20a, and the gate of the PMOS transistor mp20b. The sources of the PMOS transistors mp20a and mp20b are connected to the power supply potential.

Although not shown in FIG. 1, the node OUT is connected to a capacitor (capacitive load).

FIG. 3 shows a circuit diagram for comparison purposes of the structure of an output buffer circuit 100' that includes a capacitor circuit 30' having only capacitors CP1 and CN1, instead of the capacitor circuit 30 shown in FIG. 1. In the capacitor circuit 30', the respective one ends of the capacitors CP1 and CN1 are connected to each other at the node OUT. The other end of the capacitor CP1 is connected at the node P to the gate of the PMOS transistor mp1, and the drain of the PMOS transistor mp2. The other end of the capacitor CN1 is connected at the node N to the gate of the NMOS transistor mn1, and the drain of the NMOS transistor mn2. In such structure, the gates of the PMOS transistor mp1 and the NMOS transistor mn1 are controlled by the signals Pen and Nen via the constant current sources Is1 and Is2, respectively. The operations of the constant current sources take time, sometimes causing an increase in delay.

On the other hand, in such structure as shown in FIG. 1, the gates of the PMOS transistor mp1 and the NMOS transistor mn1 are controlled by the signals Pen and Nen via the constant current sources Is1 and Is2, respectively, and further via the PMOS transistors mp4 and mp5, and the NMOS transistors mn4 and mn5. As a result, a delay can be reduced as described below.

The operation of the output buffer circuit 100 will now be described. First, the operation when the potentials of the nodes P, N and OUT are in a stable state in the output buffer circuit 100 will be described.

The following is the case when the signal Pen becomes an L level and the signal Nen becomes an H level.

When the signal Pen becomes an L level, the PMOS transistor mp2 becomes conductive, causing the node P to become an H level. Thus the PMOS transistor mp1 is cut off. At this time, the PMOS transistor mp4 and the NMOS transistor mn4 are cut off, causing the node P to be electrically isolated from the node A. In addition, the PMOS transistor mp11a is cut off, so no current flows through a mirror circuit (P-side mirror circuit) including the NMOS transistors mn10a and mn10b (namely, the constant current source Is1 is cut off).

When the signal Nen becomes an H level, the NMOS transistor mn21a becomes conductive, causing a mirror circuit (N-side mirror circuit) including the PMOS transistors mp20a and mp20b to pass a current, which is proportional to a current flowing through the NMOS transistor mn22a based on the signal Bias2, through the PMOS transistor mp20b (namely, the constant current source Is2 becomes conductive). Thus the node N becomes an H level, rendering the NMOS transistor mn1 conductive. Accordingly, the node OUT becomes an L level. At this time, the NMOS transistor mn2 is cut off, thus preventing the node N from being connected to the ground potential. Also at this time, the PMOS transistor mp5 and the NMOS transistor mn5 become conductive, causing the node N to be electrically connected to the node A. Thus the potential of the node A becomes an H level. Namely, the capacitor C1 has one end of an L level by the node OUT and the other end of an H level by the node A, to accumulate relatively large amounts of electric charge. The capacitor C2 has one end of an H level by the node A and the other end of an H level by the output part of the inverter inv3, to accumulate relatively small amounts of electric charge.

The following is the case when the signal Pen becomes an H level and the signal Nen becomes an L level.

When the signal Nen becomes an L level, the NMOS transistor mn2 becomes conductive, causing the node N to become an L level. Thus the NMOS transistor mn1 is cut off. At this time, the PMOS transistor mp5 and the NMOS transistor mn5 are cut off, causing the node N to be electrically isolated from the node A. In addition, the NMOS transistor mn21a is cut off, so no current flows through the N-side mirror circuit including the PMOS transistors mp20a and mp20b (namely, the constant current source Is2 is cut off).

When the signal Pen becomes an H level, the PMOS transistor mp11a becomes conductive, causing the P-side mirror circuit including the NMOS transistors mn10a and mn10b to pass a current, which is proportional to a current flowing through the PMOS transistor mp10a based on the signal Bias1, through the NMOS transistor mn10b (namely, the constant current source Is1 becomes conductive). Thus the node P becomes an L level, rendering the PMOS transistor mp1 conductive. Accordingly, the node OUT becomes an H level. At this time, the PMOS transistor mp2 is cut off, thus preventing the node P from being connected to the power supply potential. Also at this time, the PMOS transistor mp4 and the NMOS transistor mn4 become conductive, causing the node P to be electrically connected to the node A. Thus the potential of the node A becomes an L level. Namely, the capacitor C1 has one end of an H level by the node OUT and the other end of an L level by the node A, to accumulate relatively large amounts of electric charge. The capacitor C2 has one end of an L level by the node A and the other end of an L level by the output part of the inverter inv3, to accumulate relatively small amounts of electric charge.

In this manner, in the output buffer circuit 100 shown in FIG. 1, the signals Pen and Nen in a reverse relationship of each other are input so that the nodes P and N become equal in logical level, and then the potentials of the nodes P and N are used to set the potential of the node OUT in the driver circuit 10. The output buffer circuit 100' shown in FIG. 3 operates the same way. FIG. 1 is different from FIG. 3 in that the node A is provided, and that continuity between the node A and the nodes P, N is controlled by the signals Pen and Nen, respectively.

That is, the signals Pen and Nen are input not only to the PMOS transistor mp2, the NMOS transistor mn2, and the constant current sources Is1 and Is2, but also to the capacitor circuit 30 in FIG. 1. Therefore, when the signals Pen and Nen are switched and the constant current sources Is1 and Is2 cannot follow the switching immediately thereafter and have not yet been switched, the potentials of the nodes P and N are switched by using the capacitor circuit 30, as described below. As a result, a switching speed of the nodes P and N (i.e. a switching speed of the node OUT) in a transition state can be increased, thereby reducing a delay.

The operation in a transition state immediately after the signals Pen and Nen are switched in the output buffer circuit 100 will now be described.

The following is the case immediately after the signal Pen is switched from an L level to an H level and the signal Nen from an H level to an L level.

When the signals Pen and Nen are switched and the constant current source Is1 cannot follow the switching immediately thereafter and has not yet been switched, the node P remains at an H level, so the node OUT remains at an L level. In such state, if the output parts of the inverters inv3 and inv4, the PMOS transistors mp4 and mp5, and the NMOS transistors mn4 and mn5 are switched (namely, the PMOS transistor mp4 and the NMOS transistor mn4 become conductive while the PMOS transistor mp5 and the NMOS transistor mn5 are cut off) following the switching of the signals Pen and Nen, the node A having been connected to the node N of an H level before the switching becomes connected to the node P of an H level by the switching. At the same time, the output part of the inverter inv3 is switched from an H level to an L level, causing the node A to be switched from an H level to an L level as well via the capacitor C2. At this time, part of the electric charge accumulated in the capacitor C1 moves to the capacitor C2. A voltage drop value at the node A is determined based on the amounts of moving electric charge. In addition, because of the connection of the node A to the node P as mentioned above, the potential of the node P is reduced to become equal to the node A, to make a transition to an L level. At the same time, the PMOS transistor mp2 is cut off while the NMOS transistor mn2 becomes conductive, causing the node N to be connected to the ground potential and become an L level.

Then, the constant current source Is1 becomes conductive while the constant current source Is2 is cut off, so the potential of the node P is reduced to an L level also by the constant current source Is1.

The following is the case immediately after the signal Pen is switched from an H level to an L level and the signal Nen from an L level to an H level.

When the signals Pen and Nen are switched and the constant current source Is2 cannot follow the switching immediately thereafter and has not yet been switched, the node N remains at an L level, so the node OUT remains at an H level. In such state, if the output parts of the inverters inv3 and inv4, the PMOS transistors mp4 and mp5, and the NMOS transistors mn4 and mn5 are switched (namely, the PMOS transistor mp4 and the NMOS transistor mn4 are cut off while the PMOS transistor mp5 and the NMOS transistor mn5 become conductive) following the switching of the signals Pen and Nen, the node A having been connected to the node P of an L level before the switching becomes connected to the node N of an L level by the switching. At the same time, the output part of the inverter inv3 is switched from an L level to an H level, causing the node A to be switched from an L level to an H level as well via the capacitor C2. At this time, part of the electric charge accumulated in the capacitor C1 moves to the capacitor C2. A voltage increase value at the node A is determined based on the amounts of moving electric charge. In addition, because of the connection of the node A to the node N as mentioned above, the potential of the node N is increased to become equal to the node A, to make a transition to an H level. At the same time, the PMOS transistor mp2 becomes conductive while the NMOS transistor mn2 is cut off, causing the node P to be connected to the power supply potential and become an H level. Then, the constant current source Is1 is cut off while the constant current source Is2 becomes conductive, so the potential of the node N is increased to an H level also by the constant current source Is2.

In short, the PMOS transistor mp1, the NMOS transistor mn1, the capacitor C1, the capacitor C2, the signal Pen, the signal Nen, and the node OUT serve as a first transistor, a second transistor, a main capacitor, an auxiliary capacitor, a first control signal, a second control signal, and an output node, respectively, according to the present invention. The capacitors C1 and C2 form a group of capacitors according to the present invention, and a signal output from the node OUT serves as a driver signal according to the present invention.

As described above, upon switching of the signals Pen and Nen, the potentials of the nodes P and N change based on the amounts of moving electric charge between the capacitors C1 and C2. Accordingly, by determining a capacity ratio between the capacitors C1 and C2 such that the change in potential of the nodes P and N corresponds to a threshold value of the PMOS transistor mp1 and the NMOS transistor mn1, a delay can be reduced upon switching of the signals Pen and Nen until the switching in potential of the node OUT.

FIGS. 4A to 4E and FIGS. 5A to 5D show timing charts of simulation waveforms of potentials of the respective signals and nodes in the output buffer circuit 100 shown in FIG. 1. The simulations were done on conditions that the power supply potential is 3.3 V, the threshold voltage of the PMOS transistors (PMOS threshold voltage Vthp) is −0.65 V, the threshold voltage of the NMOS transistors (NMOS threshold voltage Vthn) is 0.65 V, the capacitance of the capacitor not shown but connected to the node OUT is 50 pF, and the capacity ratio between the capacitors C1 and C2 is 1:2. Under these conditions, the node P changes at high speed from 3.3 V to approximately 2 V immediately after the signal Pen is switched from an L level to an H level, and the node N changes at high speed from 0 V to approximately 1.1 V immediately after the signal Nen is switched from an L level to an H level.

In such ways, in the output buffer circuit 100 according to the first preferred embodiment, the signals Pen and Nen are input not only to the constant current sources Is1 and Is2 but also directly to the capacitor circuit 30. A switching speed of the driver signal output from the node OUT can therefore be increased compared to the case of inputting the signals Pen and Nen only to the constant current sources Is1 and Is2 as shown in FIG. 3, thereby reducing an output delay.

As mentioned above, when outputting a driver signal of an H level, for instance, from the output node $v_o$ in National Publication of Translation No. 2001-508635, a delay is not reduced much if a control signal input to the input node $v_i$ remains at an L level for a long time. When outputting a driver signal of an H level, for instance, from the node OUT in the output buffer circuit 100 according to the first preferred embodiment, the node A is connected to the node N to become an H level prior to being connected to the node P, one end of the capacitor C1 is connected to the node OUT to become an L level, and the other end of the capacitor C2 is connected to the output part of the inverter inv3 to become an H level. Accordingly, the potentials of the capacitors c1 and C2 are not affected by leakage and the like, so the node P remains constant in potential at all times when connected to the node A. A constant output delay can thus be attained regardless of the waveform of a control signal input to the input node $v_i$.

Also in the output buffer circuit 100 according to the first preferred embodiment, the potential of the node OUT is returned to the nodes P and N via the capacitors C1 and C2. Accordingly, a prescribed slew rate can be set that is independent of the load of the capacitor not shown but connected to the node OUT, as in National Publication of Translation No. 2001-508635.

Although a reverse signal of the signal Pen is input to the other end of the capacitor C2 in FIG. 1, the signal Nen may alternatively be input to the other end of the capacitor C2.

Moreover, the capacitors C1 and C2 shown in FIG. 1 may be formed from any kind of material that can be formed on a semiconductor substrate. The capacitors C1 and C2 may therefore have a gate oxide film as one end and a diffusion layer as the other end, or the gate (control electrode or one side control electrode) of a MOS transistor as one end and the other end connected to the source, the drain and the back gate (other side control electrode) of the MOS transistor, or have an MIM (Metal Insulator Metal) structure including a thin silicon oxide film interposed between two metal films (the same applies to capacitors CP1, CP2, CN1 and CN2 to be described later).

Furthermore, the constant current source Is1 shown in FIG. 2 may have an alternative structure such that an NMOS transistor has a source connected to the ground potential, a drain connected to the node P, and a gate supplied with the signal Pen. The constant current source Is2 may have an alternative structure such that a PMOS transistor has a source connected to the power supply potential, a drain connected to the node N, and a gate supplied with a reverse signal of the signal Nen (the same applies to a second preferred embodiment on down).

Second Preferred Embodiment

In the output buffer circuit 100 shown in FIG. 1 according to the first preferred embodiment, the capacitors C1 and C2 are not connected to the node P or the node N at all times. It is therefore required that the node N be fixed to an H level (namely, the node A be fixed to an H level) when the signal Pen is switched from an L level to an H level and the signal Nen from an H level to an L level, for example. Accordingly, when the signals Pen and Nen have high frequencies, the potential of the node N cannot follow the switching of the signals Pen and Nen before being fixed to an H level, which may result in a variation in delay value.

FIG. 6 shows a circuit diagram of the structure of a slew-rate controlled output buffer circuit 100a according to a second preferred embodiment. FIG. 6 includes a capacitor circuit 30a instead of the capacitor circuit 30 shown in FIG. 1. The capacitor circuit 30a includes capacitors CP1, CP2, CN1, CN2, and an inverter inv5.

In the capacitor circuit 30a, the respective one ends of the capacitors CP1 and CN1 are connected to each other at the node OUT. The other end of the capacitor CP1 is connected at the node P to the gate of the PMOS transistor mp1, the drain of the PMOS transistor mp2, and one end of the capacitor CP2. The other end of the capacitor CP2 is connected to the output part of the inverter inv5. The input part of the inverter inv5 is supplied with the signal Pen.

The other end of the capacitor CN1 is connected at the node N to the gate of the NMOS transistor mn1, the drain of the NMOS transistor mn2, and one end of the capacitor CN2. The other end of the capacitor CN2 is supplied with the signal Nen.

Namely, FIG. 6 modifies the FIG. 3 structure such that the other end of the capacitor CP1 is connected to one end of the capacitor CP2 whose other end is supplied with a reverse signal of the signal Pen, while the other end of the capacitor CN1 is connected to one end of the capacitor CN2 whose other end is supplied with the signal Nen. In FIG. 6, identical elements to those in FIGS. 1 and 3 have the same reference numerals as those in FIGS. 1 and 3, to omit detailed descriptions.

The operation of the output buffer circuit 100a will now be described. The other circuits than the capacitor circuit 30a operate the same way as in the output buffer circuit 100 when the potentials of the respective nodes are in a stable state, which will not be described in detail. Described here are the states of the respective nodes and capacitors when the signal Pen becomes an L level and the signal Nen becomes an H level. At this time, the capacitor CP1 has one end of an L level by the node OUT and the other end of an H level by the node P, to accumulate relatively large amounts of electric charge. The capacitor CP2 has one end of an H level by the node P and the other end of an H level by the output part of the inverter inv5, to accumulate relatively small amounts of electric charge. The capacitor CN1 has one end of an L level by the node OUT and the other end of an H level by the node N, to accumulate relatively large amounts of electric charge. The capacitor CN2 has one end of an H level by the node N and the other end of an H level by the signal Nen, to accumulate relatively small amounts of electric charge.

The operation in a transition state immediately after the signals Pen and Nen are switched in the output buffer circuit 100a will now be described.

The following is the case immediately after the signal Pen is switched from an L level to an H level and the signal Nen from an H level to an L level.

When the signals Pen and Nen are switched and the constant current source Is1 cannot follow the switching immediately thereafter and has not yet been switched, the node P remains at an H level, so the node OUT remains at an L level. In such state, if the output part of the inverter inv5 is switched from an H level to an L level following the switching of the signals Pen and Nen, part of the electric charge accumulated in the capacitor CP1 moves to the capacitor CP2. Thus the node P makes a transition from an H level to an L level. A voltage drop value at the node P is determined based on the amounts of moving electric charge. At the same time, the PMOS transistor mp2 is cut off while the NMOS transistor mn2 becomes conductive, causing the node N to be connected to the ground potential and become an L level. Then, the constant current source Is1 becomes conductive while the constant current source Is2 is cut off, so the potential of the node P is reduced to an L level also by the constant current source Is1.

The following is the case immediately after the signal Pen is switched from an H level to an L level and the signal Nen from an L level to an H level.

When the signals Pen and Nen are switched and the constant current source Is2 cannot follow the switching immediately thereafter and has not yet been switched, the node N remains at an L level, so the node OUT remains at an H level. In such state, part of the electric charge accumulated in the capacitor CN1 moves to the capacitor CN2 following the switching of the signal Nen. Thus the node N makes a transition from an L level to an H level. A voltage increase value at the node N is determined based on the amounts of moving electric charge. At the same time, the PMOS transistor mp2 becomes conductive while the NMOS transistor mn2 is cut off, causing the node P to be connected to the power supply potential and become an H level. Then, the constant current source Is1 is cut off while the constant current source Is2 becomes conductive, so the potential of the node N is increased to an H level also by the constant current source Is2.

In short, the capacitors CP1, CN1, CP2, and CN2 serve as first to fourth capacitors, respectively, according to the present invention.

As mentioned above, when outputting a driver signal of an H level, for instance, from the node OUT in the output buffer circuit 100 according to the first preferred embodiment, the node A is expected to be connected to the node N to become the power supply potential level prior to being connected to the node P. When the driver signal to be output increases in frequency, however, the potential of the node N does not reach the power supply potential level (period T2 in FIG. 5). Thus the potential of the node A too becomes lower than the power supply potential level. This causes the node P to be lower than a desired potential when the signal Pen is switched from an L level to an H level and the signal Nen from an H level to an L level, to connect the node A to the node P. This may delay an output from the node OUT, thus affecting the slew rate. Meanwhile, when outputting a driver signal of an H level from the node OUT in the output buffer circuit 100a according to the second preferred embodiment, the potential of the node P is an H level in the prior stage. Thus the potential of the node P remains constant at all times upon switching of the signal Pen from an L level to an H level and the signal Nen from an H level to an L level. Accordingly, a constant output delay can be attained while maintaining a desired slew rate even when the driver signal to be output increases in frequency (the same applies to when outputting a driver signal of an L level).

In such ways, in the output buffer circuit 100a according to the second preferred embodiment, the capacitors CP1 and CP2 are connected to the node P and the capacitors CN1 and CN2 are connected to the node N at all times. The result is that a delay value can be stabilized with the signals Pen and Nen of high frequencies, in addition to the effect of the first preferred embodiment.

A capacity ratio between the capacitors CP1 and CP2, and a capacity ratio between the capacitors CN1 and CN2 may be determined in accordance with the power supply potential and the threshold voltage of the MOS transistors. For instance, on conditions that the power supply potential is 3.3 V, the threshold voltage of the PMOS transistors (PMOS threshold voltage Vthp) is −0.65 V, and the threshold voltage of the NMOS transistors (NMOS threshold voltage Vthn) is 0.65 V, the capacity ratios between the capacitors c1 and C2 and between the capacitors CN1 and CN2 may be determined approximately in the range from 1:2 to 1:4 (the same applies to a third preferred embodiment on down).

Third Preferred Embodiment

In the output buffer circuit 100a shown in FIG. 6 according to the second preferred embodiment, the capacitors CP2 and CN2 are out of contact with the node OUT, and are thus not used for slew rate control. Alternatively, the capacitors CP2 and CN2 may be disposed to come into contact with the node OUT, to be used for slew rate control.

FIG. 7 shows a circuit diagram of the structure of a slew-rate controlled output buffer circuit 100b according to a third preferred embodiment. FIG. 7 includes a capacitor circuit 30b instead of the capacitor circuit 30 shown in FIG. 1. The capacitor circuit 30b includes the capacitors CP1, CP2, CN1, CN2, the inverter inv5, PMOS transistors mp6 and mp7, and NMOS transistors mn6 and mn7.

In the capacitor circuit 30b, the respective one ends of the capacitors CP1, CP2, CN1, and CN2 are connected to each other at the node OUT. The other end of the capacitor CP1 is connected at the node P to the gate of the PMOS transistor mp1, the drain of the PMOS transistor mp2, and the source of the PMOS transistor mp6. The other end of the capacitor CP2 is connected at a node B to the drains of the PMOS transistor mp6 and NMOS transistor mn6. The gates of the PMOS transistor mp6 and the NMOS transistor mn6 are connected to the output part of the inverter inv5. The input part of the inverter inv5 is supplied with the signal Pen. The source of the NMOS transistor mn6 is connected to the ground potential.

The other end of the capacitor CN1 is connected at the node N to the gate of the NMOS transistor mn1, the drain of the NMOS transistor mn2, and the source of the NMOS transistor mn7. The other end of the capacitor CN2 is connected at a node C to the drains of the PMOS transistor mp7 and the NMOS transistor mn7. The gates of the PMOS transistor mp7 and the NMOS transistor mn7 are supplied with the signal Nen. The source of the PMOS transistor mp7 is connected to the power supply potential.

Namely, FIG. 7 modifies the FIG. 6 structure such that the capacitors CP1 and CP2, and the capacitors CN1 and CN2 are connected in parallel to have their respective other ends connected to the PMOS transistor mp6 or the NMOS transistor mn7, while being connected to the ground potential via the NMOS transistor mn6 or to the power supply potential via the PMOS transistor mp7. In FIG. 7, identical elements to those in FIGS. 1 and 6 have the same reference numerals as those in FIGS. 1 and 6, to omit detailed descriptions.

The operation of the output buffer circuit 100b will now be described. The other circuits than the capacitor circuit 30b operate the same way as in the output buffer circuit 100 when the potentials of the respective nodes are in a stable state, which will not be described in detail. Described here are the states of the respective nodes and capacitors when the signal Pen becomes an L level and the signal Nen becomes an H level. At this time, the capacitor CP1 has one end of an L level by the node OUT and the other end of an H level by the node P, to accumulate relatively large amounts of electric charge. The capacitor CP2 has one end of an L level by the node OUT and the other end of an L level due to the connection to the ground potential, to accumulate relatively small amounts of electric charge. The capacitor CN1 has one end of an L level by the node OUT and the other end of an H level by the node N, to accumulate relatively large amounts of electric charge. The capacitor CN2 has one end of an L level by the node OUT and the other end of an H level by the node N, to accumulate relatively large amounts of electric charge.

The operation in a transition state immediately after the signals Pen and Nen are switched in the output buffer circuit 100b will now be described.

The following is the case immediately after the signal Pen is switched from an L level to an H level and the signal Nen from an H level to an L level.

When the signals Pen and Nen are switched and the constant current source Is1 cannot follow the switching immediately thereafter and has not yet been switched, the node P remains at an H level, so the node OUT remains at an L level. In such state, if the output part of the inverter inv5, the PMOS transistors mp6 and mp7, and the NMOS transistors mn6 and mn7 are switched (namely, the PMOS transistors mp6 and mp7 become conductive while the NMOS transistors nm6 and nm7 are cut off) following the switching of the signals Pen and Nen, the node B having been connected to the ground potential before the switching becomes connected to the node P of an H level by the switching, while the node C having been connected to the node N of an H level before the switching becomes connected to the power supply potential by the switching. At this time, part of the electric charge accumulated in the capacitor CP1 moves to the capacitor CP2. A voltage increase value at the node B is determined based on the amounts of moving electric charge. In addition, because of the connection of the node B to the node P as mentioned above, the potential of the node P is reduced to become equal to the node B, to make a transition to an L level. At the same time, the PMOS transistor mp2 is cut off while the NMOS transistor mn2 becomes conductive, causing the node N to be connected to the ground potential and become an L level. Then, the constant current source Is1 becomes conductive while the constant current source Is2 is cut off, so the potential of the node P is reduced to an L level also by the constant current source Is1.

The following is the case immediately after the signal Pen is switched from an H level to an L level and the signal Nen from an L level to an H level.

When the signals Pen and Nen are switched and the constant current source Is2 cannot follow the switching immediately thereafter and has not yet been switched, the node N remains at an L level, so the node OUT remains at an H level. In such state, if the output part of the inverter inv5, the PMOS transistors mp6 and mp7, and the NMOS transistors mn6 and mn7 are switched (namely, the PMOS transistors mp6 and mp7 are cut off while the NMOS transistors mn6 and mn7 become conductive) following the switching of the signals Pen and Nen, the node B having been connected to the node P of an L level before the switching becomes connected to the ground potential by the switching, while the node C having been connected to the power supply potential before the switching becomes connected to the node N of an L level by the switching. At this time, part of the electric charge accumulated in the capacitor CN1 moves to the capacitor CN2. A voltage increase value at the node C is determined based on the amounts of moving electric charge. In addition, because of the connection of the node C to the node N as mentioned above, the potential of the node N is increased to become equal to the node C, to make a transition to an H level. At the same time, the PMOS transistor mp2 becomes conductive while the NMOS transistor mn2 is cut off, causing the node P to be connected to the power supply potential and become an H level. Then, the constant current source Is1 is cut off while the constant current source Is2 becomes conductive, so the potential of the node N is increased to an H level also by the constant current source Is2.

In the output buffer circuit 100b shown in FIG. 7 where the capacitors CP2 and CN2 are disposed to come into contact with the node OUT, not only the capacitors CP1 and CN1 but also the capacitors CP2 and CN2 can be used for slew rate control. In the output buffer circuit 100b, namely, the same capacitance as the capacitor CP1 (or CN1) shown in FIG. 6 according to the third preferred embodiment may be attained by the sum of the capacitances of the capacitors CP1 and CP2 (or the sum of the capacitances of the capacitors CN1 and CN2). The layout area of the capacitors can therefore be reduced compared to the second preferred embodiment.

In such ways, in the output buffer circuit 100b according to the third preferred embodiment, the capacitors CP2 and CN2 are disposed to come into contact with the node OUT, to be used for slew rate control. The result is that the layout area of the capacitors can be reduced, in addition to the effect of the second preferred embodiment.

Fourth Preferred Embodiment

Figure 8:
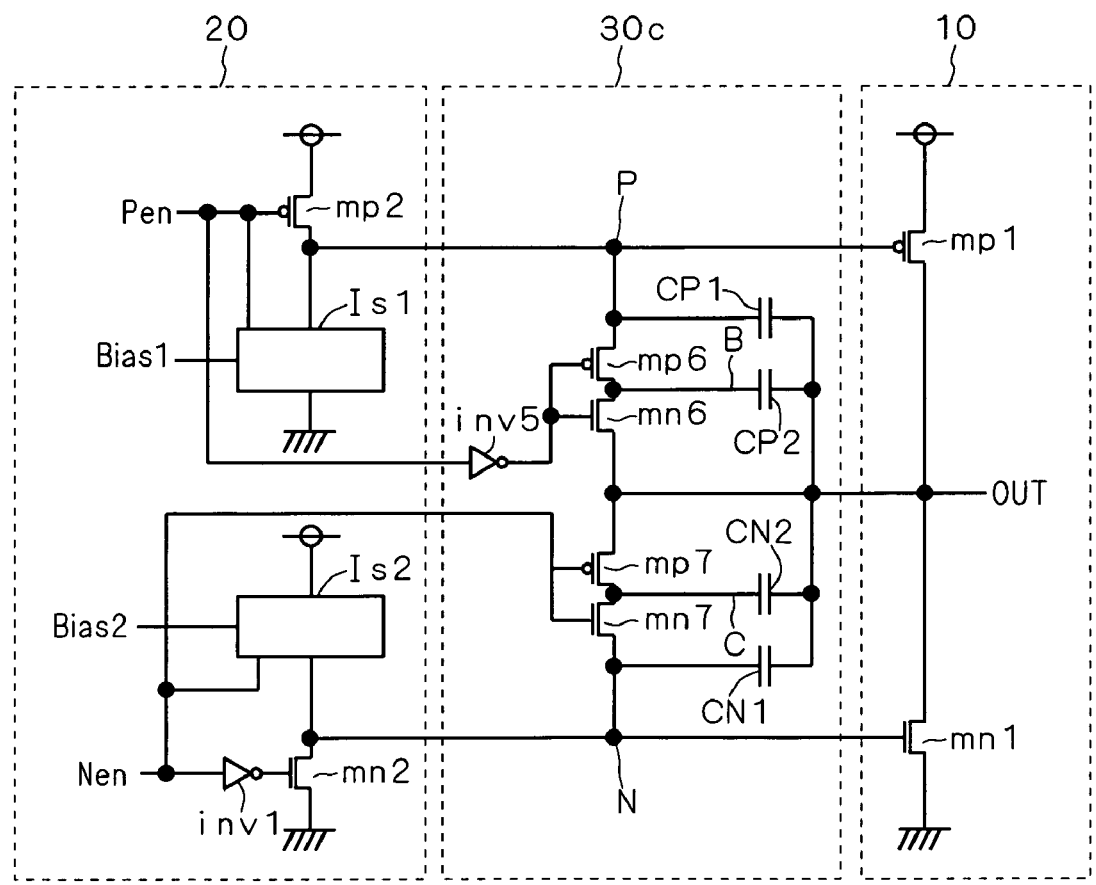
FIG. 8 shows a circuit diagram of the structure of an output buffer circuit according to a fourth preferred embodiment.

FIG. 8 shows a circuit diagram of the structure of a slew-rate controlled output buffer circuit 100c according to a fourth preferred embodiment. FIG. 8 modifies the FIG. 7 structure by providing a capacitor circuit 30c instead of the capacitor circuit 30b. The capacitor circuit 30c has a structure such that the sources of the PMOS transistor mp7 and the NMOS transistor mn6 are connected to each other at the node OUT in the capacitor circuit 30b shown in FIG. 7. In FIG. 8, identical elements to those in FIG. 7 have the same reference numerals as those in FIG. 7, to omit detailed descriptions.

In FIG. 8, the node OUT becomes an L level when the signal Pen becomes an L level and the signal Nen becomes an H level, as mentioned above, causing the source of the NMOS transistor mn6 to become an L level and conductive. At this time, the PMOS transistor mp7 is cut off, thus presenting no problem with its source becoming an L level. Meanwhile, the node OUT becomes an H level when the signal Pen becomes an H level and the signal Nen becomes an L level, causing the source of the PMOS transistor mp7 to become an H level and conductive. At this time, the NMOS transistor mn6 is cut off, thus presenting no problem with its source becoming an H level.

In such ways, the output buffer circuit 100c according to the fourth preferred embodiment produces the same effect as the third preferred embodiment.

Fifth Preferred Embodiment

When the PMOS transistors mp10a and mp11a, and the NMOS transistor mn10a are all conductive, or when the NMOS transistors mn22a and mn21a, and the PMOS transistor mp20a are all conductive in the driver control circuit 20 shown in FIG. 2 according to the first preferred embodiment, current may flow through these transistors from the power supply potential to the ground potential.

Figure 9:
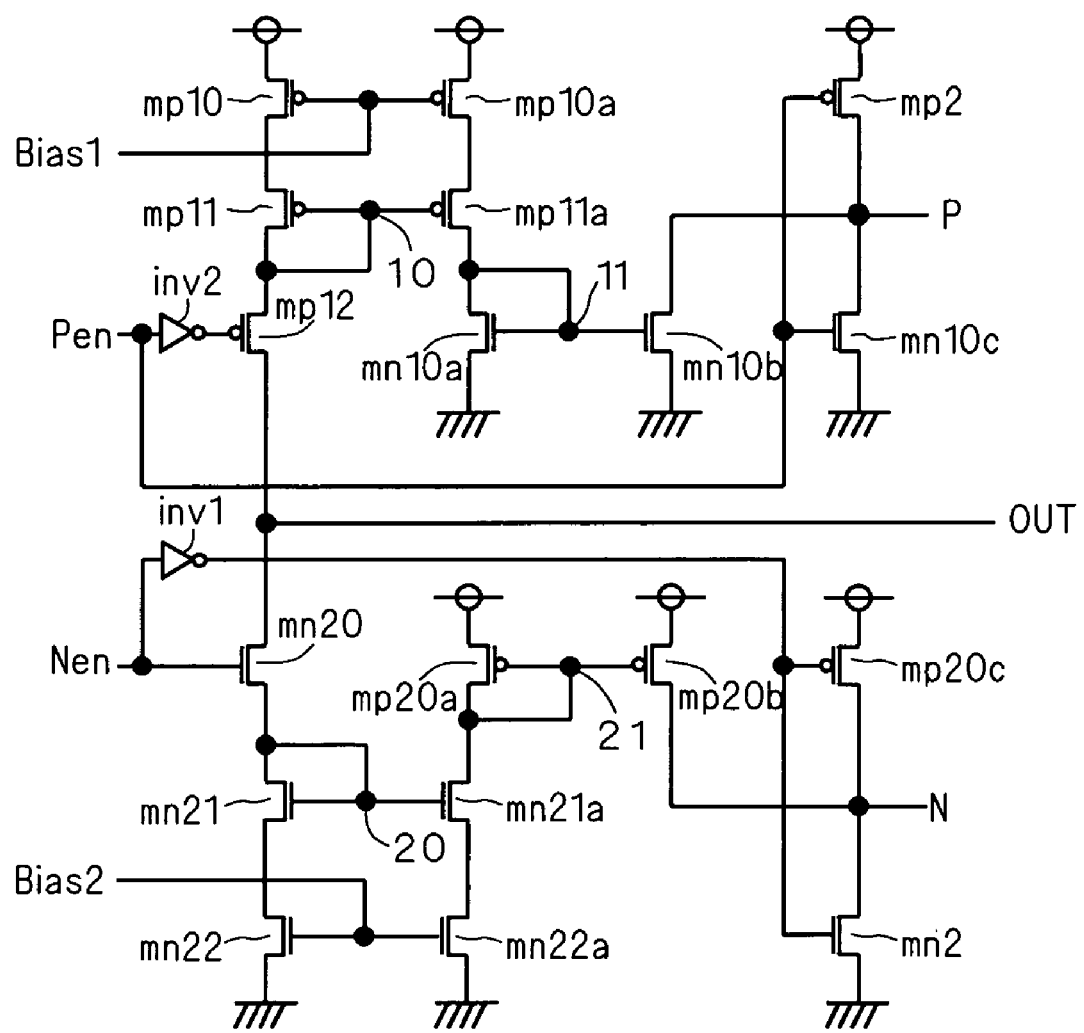
FIG. 9 shows a circuit diagram of the structure of a driver control circuit according to a fifth preferred embodiment.

FIG. 9 shows a circuit diagram of the structure of a driver control circuit 20a according to a fifth preferred embodiment. FIG. 9 modifies the FIG. 2 structure such that PMOS transistors mp10, mp11, mp12 and mp20c, and NMOS transistors mn10c, mn20, mn21 and mn22 are added, the inverter inv2 supplied with the signal Pen is connected to the gate of the PMOS transistor mp12 instead of the gate of the PMOS transistor mp11a, and the signal Nen is input to the gate of the NMOS transistor mn20 instead of the gate of the NMOS transistor mn21a. While the driver control circuit 20a will be used below instead of the driver control circuit 20 in the output buffer circuit 100 shown in FIG. 1, the driver control circuit 20a may alternatively be used in the output buffer circuit 100' shown in FIG. 3, the output buffer circuit 100a shown in FIG. 6, the output buffer circuit 100b shown in FIG. 7, and the output buffer circuit 100c shown in FIG. 8.

In FIG. 9, the source of the PMOS transistor mp10 is connected to the power supply potential. The drain of the PMOS transistor mp10 is connected to the source of the PMOS transistor mp11. The gate of the PMOS transistor mp10 is connected to the gate of the PMOS transistor mp10a. The drain of the PMOS transistor mp11 is connected at a node 10 to the source of the PMOS transistor mp12, the gate of the PMOS transistor mp11, and the gate of the PMOS transistor mp11a. The drain of the PMOS transistor mp12 is connected at the node OUT to the drain of the NMOS transistor mn20.

The source of the NMOS transistor mn22 is connected to the ground potential. The drain of the NMOS transistor mn22 is connected to the source of the NMOS transistor mn21. The gate of the NMOS transistor mn22 is connected to the gate of the NMOS transistor mn22a. The drain of the NMOS transistor mn21 is connected at a node 20 to the source of the NMOS transistor mn20, the gate of the NMOS transistor mn21, and the gate of the NMOS transistor mn21a.

The drain of the NMOS transistor mn10c is connected at the node P to the drain of the PMOS transistor mp2. The source of the NMOS transistor mn10c is connected to the ground potential.

The drain of the PMOS transistor mp20c is connected at the node N to the drain of the NMOS transistor mn2. The source of the PMOS transistor mp20c is connected to the power supply potential.

In FIG. 9, the NMOS transistor mn10c and the PMOS transistor mp20c shall have sufficiently small driving ability compared to the NMOS transistor mn10b and the PMOS transistor mp20b, respectively. Namely, the NMOS transistor mn10c becomes conductive when the signal Pen becomes an H level and the output buffer circuit 100 enters a stable state, thus connecting the node P to the ground potential to fix the node P to an L level. And the PMOS transistor mp20c becomes conductive when the signal Nen becomes an H level and the output buffer circuit 100 enters a stable state, thus connecting the node N to the power supply potential to fix the node N to an H level. In FIG. 9, identical elements to those in FIG. 1 have the same reference numerals as those in FIG. 1, to omit detailed descriptions.

The operation of the output buffer circuit 100 (which includes the driver control circuit 20a instead of the driver control circuit 20) will now be described. First, the operation when the potentials of the nodes P, N and OUT are in a stable state in the output buffer circuit 100 will be described.

The following is the case when the signal Pen becomes an L level and the signal Nen becomes an H level.

When the signal Pen becomes an L level, the PMOS transistor mp2 becomes conductive, causing the node P to become an H level. Thus the PMOS transistor mp1 is cut off. At this time, the PMOS transistor mp4 and the NMOS transistor mn4 are cut off, causing the node P to be electrically isolated from the node A. In addition, the PMOS transistor mp12 is cut off, so no current flows through a mirror circuit (second P-side mirror circuit) including the PMOS transistors mp11 and mp11a, and the mirror circuit (P-side mirror circuit) including the NMOS transistors mn10a and mn10b (namely, the constant current source Is1 is cut off). At this time, the NMOS transistor mn10c is cut off, thus preventing the node P from being connected to the ground potential. In addition, the PMOS transistor mp12 is cut off, causing the node OUT to be electrically isolated from the node 10.

When the signal Nen becomes an H level, the PMOS transistor mp20c becomes conductive, causing the node N to become an H level. Thus the NMOS transistor mn1 becomes conductive. Accordingly, the node OUT becomes an L level. At this time, the NMOS transistor mn2 is cut off, thus preventing the node N from being connected to the ground potential. Also at this time, the PMOS transistor mp5 and the NMOS transistor mn5 become conductive, causing the node N to be electrically connected to the node A. Thus the potential of the node A becomes an H level. At this time, although the NMOS transistor mn20 becomes conductive, the node OUT is an L level, so no current flows through a mirror circuit (second N-side mirror circuit) including the NMOS transistors mn21 and mn21a, and the mirror circuit (N-side mirror circuit) including the PMOS transistors mp20a and mp20b (namely, the constant current source Is2 is cut off).

The following is the case when the signal Pen becomes an H level and the signal Nen becomes an L level.

When the signal Nen becomes an L level, the NMOS transistor mn2 becomes conductive, causing the node N to become an L level. Thus the NMOS transistor mn1 is cut off. At this time, the PMOS transistor mp5 and the NMOS transistor mn5 are cut off, causing the node N to be electrically isolated from the node A. In addition, the NMOS transistor mn20 is cut off, so no current flows through the second N-side mirror circuit including the NMOS transistors mn21 and mn21a, and the N-side mirror circuit including the PMOS transistors mp20a and mp20b (namely, the constant current source Is2 is cut off). At this time, the PMOS transistor mp20c is cut off, thus preventing the node N from being connected to the power supply potential. In addition, the NMOS transistor mn20 is cut off, causing the node OUT to be electrically isolated from the node 20.

When the signal Pen becomes an H level, the NMOS transistor mn10c becomes conductive, causing the node P to become an L level. Thus the PMOS transistor mp1 becomes conductive. Accordingly, the node OUT becomes an H level. At this time, the PMOS transistor mp2 is cut off, thus preventing the node P from being connected to the power supply potential. Also at this time, the PMOS transistor mp4 and the NMOS transistor mn4 become conductive, causing the node P to be electrically connected to the node A. Thus the potential of the node A becomes an L level. At this time, although the PMOS transistor mp12 becomes conductive, the node OUT is an H level, so no current flows through the second P-side mirror circuit including the PMOS transistors mp11 and mp11a, and the P-side mirror circuit including the NMOS transistors mn10a and mn10b (namely, the constant current source Is1 is cut off).

In such ways, unlike the driver control circuit 20 shown in FIG. 2 according to the first preferred embodiment, both of the constant current sources Is1 and Is2 are cut off, and the potential of the node P or the node N is fixed by the NMOS transistor mn10c or the PMOS transistor mp20c in a stable state in the driver control circuit 20a according to the fifth preferred embodiment. This allows a reduction in a period of time during which the PMOS transistors mp10a and mp11a, and the NMOS transistor mn10a are all conductive, or the NMOS transistors mn21a and mn22a, and the PMOS transistor mp20a are all conductive compared to the driver control circuit 20 shown in FIG. 2 according to the first preferred embodiment, thereby reducing the amount of current that flows through these transistors from the power supply potential to the ground potential.

In short, the NMOS transistor mn10c and the PMOS transistor mp20c serve as a first fixing circuit and a second fixing circuit, respectively, according to the present invention.

While the constant current sources Is1 and Is2 become conductive to set the potential of the node P or the node N in a transition state as described later, the constant current sources Is1 and Is2 are cut off with a transition to a stable state as mentioned above, so that their ability to drive the PMOS transistor mp1 or the NMOS transistor mn1 can be weakened. Consequently, an overshoot or an undershoot of the output waveforms can be suppressed.

The operation in a transition state immediately after the signals Pen and Nen are switched in the output buffer circuit 100 will now be described.

The following is the case immediately after the signal Pen is switched from an L level to an H level and the signal Nen from an H level to an L level.

When the signals Pen and Nen are switched and the constant current source Is1 cannot follow the switching immediately thereafter and has not yet been switched, the node P remains at an H level, so the node OUT remains at an L level. At this time, the PMOS transistor mp12 becomes conductive, causing the second P-side mirror circuit including the PMOS transistors mp11 and mp11a, and the P-side mirror circuit including the NMOS transistors mn10a and mn10b to pass a current proportional to a current flowing through the PMOS transistor mp10 based on the signal Bias1 through the PMOS transistor mp10a, and a current proportional to a current flowing through the PMOS transistor mp10a through the NMOS transistor mn10b (namely, the constant current source Is1 becomes conductive). Thus the potential of the node P is reduced, to make a transition to an L level. After the node P becomes an L level to render the PMOS transistor mp1 conductive, the potential of the node OUT becomes an H level. Accordingly, current eventually ceases to flow through the PMOS transistor mp10, causing the constant current source Is1 to be cut off (actually the constant current source Is1 is cut off before the potential of the node OUT reaches the power supply potential).

The following is the case immediately after the signal Pen is switched from an H level to an L level and the signal Nen from an L level to an H level.

When the signals Pen and Nen are switched and the constant current source Is2 cannot follow the switching immediately thereafter and has not yet been switched, the node N remains at an L level, so the node OUT remains at an H level. At this time, the NMOS transistor mn20 becomes conductive, causing the second N-side mirror circuit including the NMOS transistors mn21 and mn21a, and the N-side mirror circuit including the PMOS transistors mp20a and mp20b to pass a current proportional to a current flowing through the NMOS transistor mn22 based on the signal Bias2 through the NMOS transistor mn22a, and a current proportional to a current flowing through the NMOS transistor mn22a through the PMOS transistor mp20b (namely, the constant current source Is2 becomes conductive). Thus the potential of the node N is increased, to make a transition to an H level. After the node N becomes an H level to render the NMOS transistor mn1 conductive, the potential of the node OUT becomes an L level. Accordingly, current eventually ceases to flow through the NMOS transistor mn22, causing the constant current source Is2 to be cut off (actually the constant current source Is2 is cut off before the potential of the node OUT reaches the ground potential).

In such ways, in the driver control circuit 20a according to the fifth preferred embodiment, no current flows through the PMOS transistors mp10a, mp11a and the NMOS transistor mn10a, or the NMOS transistors mn22a, mn21a and the PMOS transistor mp20a in a stable state. The result is that an unnecessary current can be reduced compared to the driver control circuit 20 shown in FIG. 2 according to the first preferred embodiment.

Also in the driver control circuit 20a according to the fifth preferred embodiment, the constant current sources Is1 and Is2 are cut off with a transition to a stable state, thus weakening their ability to drive the PMOS transistor mp1 or the NMOS transistor mn1. Consequently, an overshoot or an undershoot of the output waveforms can be suppressed compared to the driver control circuit 20 shown in FIG. 2 according to the first preferred embodiment.

Sixth Preferred Embodiment

In the first to fifth preferred embodiments, a signal is output from the node OUT by inputting the signals Pen and Nen in a reverse relationship of each other. In protocols such as ATA/ATAPI, however, a signal may be input from the node OUT to an output buffer circuit. At this time, the output buffer circuit operates in such a way that the signals Pen and Nen are rendered an L level to cut the PMOS transistor mp1 and the NMOS transistor mn1 off, causing the node OUT to have high impedance. Because a signal to be input based on those protocol standards are higher (5.5 VDC) than the power supply potential (3.3 V±0.8 V), the output buffer circuit is required to have a further higher breakdown voltage.

Figure 10:
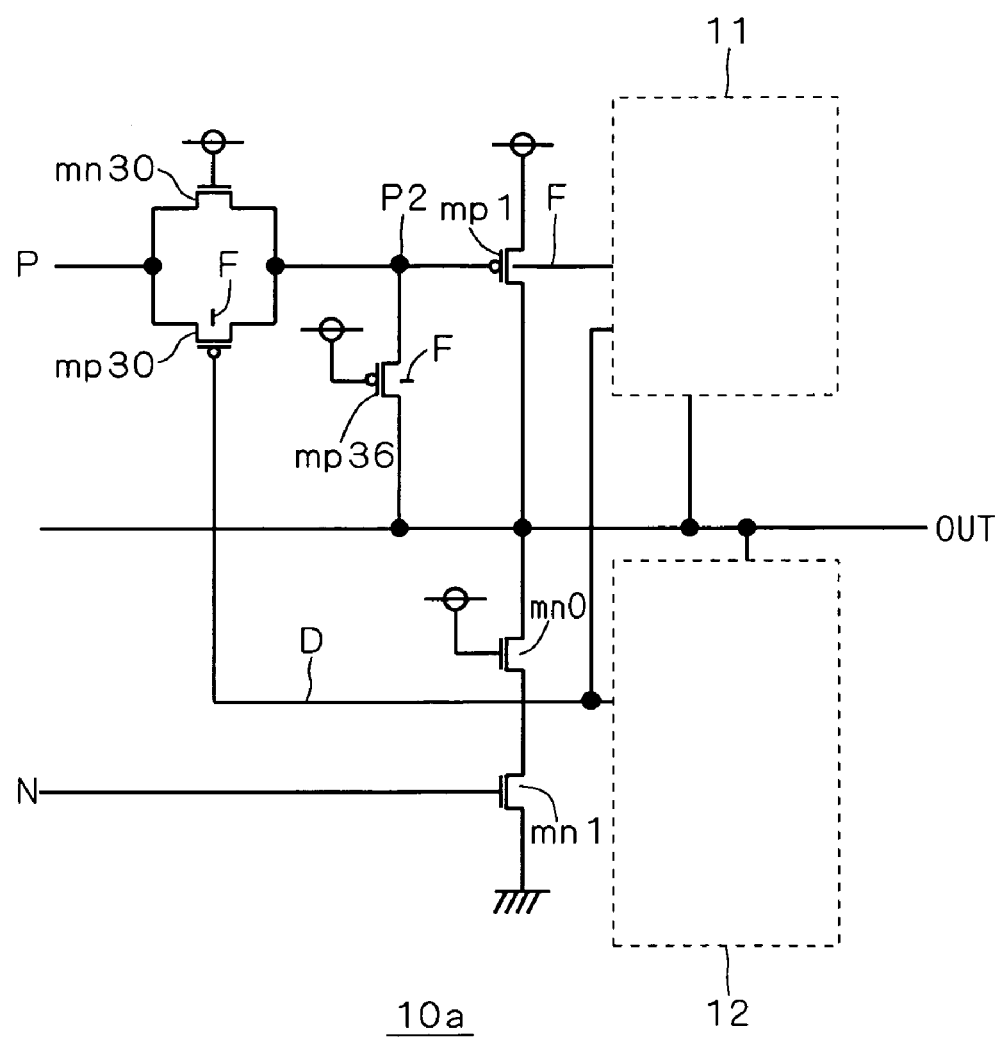
FIG. 10 shows a circuit diagram of the structure of a driver circuit according to a sixth preferred embodiment.
Figure 11:
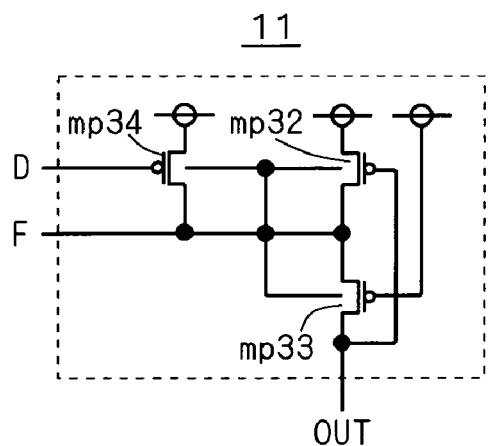
FIGS. 11 and 12 show circuit diagrams of the structures of potential control circuits according to the sixth preferred embodiment.
Figure 12:
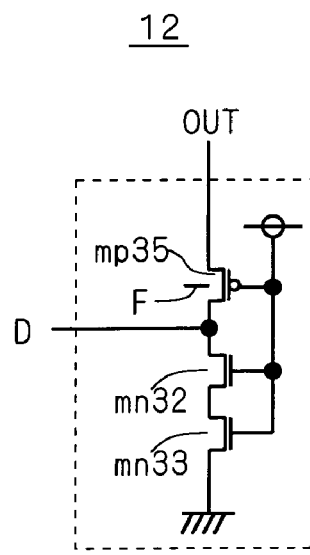

FIG. 10 shows a circuit diagram of the structure of a driver circuit 10a according to a sixth preferred embodiment. As shown, the driver circuit 10a includes potential control circuits 11 and 12, PMOS transistors mp1, mp30 and mp36, and NMOS transistors mn0, mn1 and mn30. FIGS. 11 and 12 show circuit diagrams of detailed structures of the potential control circuits 11 and 12 shown in FIG. 10, respectively. The potential control circuit 11 usually outputs the power supply potential to a node F and, only when a potential applied to the node OUT exceeds the power supply potential, outputs the potential applied to the node OUT to the node F. The potential control circuit 12 usually outputs the ground potential to a node D and, only when a potential applied to the node OUT exceeds the power supply potential, outputs the potential applied to the node OUT to the node D. The driver circuit 10a may be used in the output buffer circuit 100 shown in FIG. 1, or may alternatively be used in the output buffer circuit 100' shown in FIG. 3, the output buffer circuit 100a shown in FIG. 6, the output buffer circuit 100b shown in FIG. 7, or the output buffer circuit 100c shown in FIG. 8.

As shown in FIG. 11, the potential control circuit 11 includes PMOS transistors mp32, mp33 and mp34. As shown in FIG. 12, the potential control circuit 12 includes NMOS transistors mn32 and mn33, and a PMOS transistor mp35.

In FIGS. 10 to 12, the source of the PMOS transistor mp1 is connected to the power supply potential. The drain of the PMOS transistor mp1 is connected at the node OUT to the drain of the PMOS transistor mp36, the drain of the NMOS transistor mn0, the potential control circuit 11 (the drain of the PMOS transistor mp33 and the gate of the PMOS transistor mp32), and the potential control circuit 12 (the source of the PMOS transistor mp35). The gate of the PMOS transistor mp1 is connected at a node P2 to one end of the NMOS transistor mn30, one end of the PMOS transistor mp30, and the source of the PMOS transistor mp36. The back gate of the PMOS transistor mp1 is connected at the node F to the potential control circuit 11 (the drain and the back gate of the PMOS transistor mp32, the back gate of the PMOS transistor mp33, the drain of the PMOS transistor mp34, and the back gate of the PMOS transistor mp34), the potential control circuit 12 (the back gate of the PMOS transistor mp35), the back gate of the PMOS transistor mp30, and the back gate of the PMOS transistor mp36 (the connection relationship of the node F is partly omitted for convenience' sake in FIG. 10).

The other end of the NMOS transistor mn30 is connected at the node P to the other end of the PMOS transistor mp30. The gate of the PMOS transistor mp30 is connected at the node D to the potential control circuit 11 (the gate of the PMOS transistor mp34), and the potential control circuit 12 (the drain of the PMOS transistor mp35 and the drain of the NMOS transistor mn32).

The source of the NMOS transistor mn0 is connected to the drain of the NMOS transistor mn1. The source of the NMOS transistor mn1 is connected to the ground potential. The gate of the NMOS transistor mn1 is connected to the node N.

The gates of the PMOS transistors mp33, mp35 and mp36 and the gates of the NMOS transistors mn0, mn30, mn32 and mn33 are connected to the power supply potential. The drains of the PMOS transistors mp32 and mp34 are connected to the power supply potential. The source of the NMOS transistor mn33 is connected to the ground potential. The drain of the NMOS transistor mn33 is connected to the source of the NMOS transistor mn32.

In FIG. 10, identical elements to those in FIG. 1 have the same reference numerals as those in FIG. 1, to omit detailed descriptions.

First, the operations of the potential control circuit 11 shown in FIG. 11 and the potential control circuit 12 shown in FIG. 12 will be described.

In FIG. 11, when the node OUT is the ground potential, the node D is an L level, the PMOS transistor mp33 is cut off, the PMOS transistors mp32 becomes conductive, and the PMOS transistor mp34 becomes conductive. Thus the node F becomes the power supply potential level (H level).

Then, when the node OUT increases to (power supply potential−PMOS threshold voltage Vthp) or less (when the power supply potential is 3.3 V, Vthp is −0.7 V, and the potential of the node OUT is 3.7 V, for example), the node D is an L level, the PMOS transistor mp33 is cut off, the PMOS transistor mp32 is cut off, and the PMOS transistor mp34 becomes conductive. Thus the node F becomes the power supply potential level (H level).

Then, when the node OUT further increases to exceed (power supply potential−PMOS threshold voltage Vthp), the node D is an H level, the PMOS transistor mp33 becomes conductive, the PMOS transistor mp32 is cut off, and the PMOS transistor mp34 is cut off. Thus the node F becomes a potential level (H level) applied to the node OUT. Consequently, the potential control circuit 11 can operate in such a way as to usually output the power supply potential level (H level) to the node F and, when a potential applied to the node OUT exceeds the power supply potential, output the potential applied to the node OUT to the node F.

In FIG. 12, when the node OUT is the ground potential, the PMOS transistor mp35 is cut off, the NMOS transistors mn32 becomes conductive, and the NMOS transistor mn33 becomes conductive. Thus the node D becomes the ground potential level (L level).

Then, when the node OUT increases to exceed (power supply potential+PMOS threshold voltage Vthp), the PMOS transistor mp35 becomes conductive, the NMOS transistor mn32 becomes conductive, and the NMOS transistor mn33 becomes conductive. Since the NMOS transistors mn32 and mn33 have sufficiently small current-driving ability compared to the PMOS transistor mp36, the node D becomes a potential level (H level) applied to the node OUT. Consequently, the potential control circuit 12 can operate in such a way as to usually output an L level to the node D and, when a potential applied to the node OUT exceeds the power supply potential, output the potential applied to the node OUT to the node D.

Next, the operation of the driver circuit 10a shown in FIG. 10 will be described.

When both of the signals Pen and Nen become an L level, the PMOS transistor mp1 and the NMOS transistor mn1 are cut off, causing the node OUT to have high impedance. In this high impedance state, with the node OUT being applied with a high voltage (5.5 V) when a signal is input from the node OUT as mentioned above, the PMOS transistor mp1 may not be positively cut off in such structure as the driver circuit 100 shown in FIG. 1 where only the gate of the PMOS transistor mp1 is applied with the power supply potential.

Unlike the driver circuit 100 shown in FIG. 1 and the like, the driver circuit 10a is structured such that the back gate of the PMOS transistor mp1 is connected to the node F whose potential is controlled by the potential control circuit 11. Accordingly, when a potential applied to the node OUT exceeds the power supply potential, the potential applied to the node OUT is applied to the back gate of the PMOS transistor mp1. Also in the driver circuit 10a, the PMOS transistor mp36 has a source connected at the node P2 to the gate of the PMOS transistor mp1, and a drain connected to the node OUT. Accordingly, the PMOS transistor mp36 becomes conductive when a potential applied to the node OUT exceeds the power supply potential, causing the potential applied to the node OUT to be applied to the gate of the PMOS transistor mp1. Namely, in the driver circuit 10a, when a potential applied to the node OUT exceeds the power supply potential, the potential applied to the node OUT is applied to the back gate and the gate of the PMOS transistor mp1, thereby positively cutting the PMOS transistor mp1 off.

Again unlike the driver circuit 100 shown in FIG. 1 and the like, the driver circuit 10a includes (a switch having) the PMOS transistor mp30 and the NMOS transistor mn30 interposed between the PMOS transistor mp1 and the node P. As mentioned above, when a potential applied to the node OUT exceeds the power supply potential, the nodes D and F become equal to the potentials applied to the node OUT by the potential control circuits 12 and 11, respectively. Accordingly, the PMOS transistor mp30 is cut off at this time. The NMOS transistor mn30 becomes conductive due to its gate connected to the power supply potential, but has high impedance when a drain-source voltage VDS is greater than (gate voltage VGS–NMOS threshold voltage Vthn). Accordingly, when a potential applied to the node OUT exceeds the power supply potential, no current flows across the node P of a power supply potential level and the node P2 of an equal potential to the node OUT (namely, a potential higher than the power supply potential). In such ways, the gate of the PMOS transistor mp1 is applied with a gate potential via the node P2 instead of being directly connected to the node P. The gate of the PMOS transistor mp1 can therefore be applied with a potential higher than the power supply potential, to be positively cut off.

Again unlike the driver circuit 100 shown in FIG. 1 and the like, the driver circuit 10a includes the NMOS transistor mn0 interposed between the node OUT and the NMOS transistor mn1. Usually, with respect to a transistor having a breakdown voltage conforming to an output breakdown voltage (3.3 V, for example), the direct input of a potential exceeding the breakdown voltage (5.5 V, for example) to the transistor causes a drain-source voltage VDS or a drain-gate voltage VGD to exceed the breakdown voltage to become 5.5V, resulting in such problems as a transistor failure or life deterioration due to overstress. To address those problems, the NMOS transistor mn0 is interposed. The NMOS transistor mn0 becomes conductive due to its gate connected to the power supply potential. But when the potential of the node OUT is greater than (gate voltage VGS (power supply voltage)–NMOS threshold voltage Vthn), a current (IDS) that can be passed across the drain and source of the NMOS transistor mn0 exhibits saturation characteristics. Thus when a potential applied to the node OUT exceeds the power supply voltage, the potential exceeding the power supply voltage is not applied to the drain of the NMOS transistor mn1. Consequently, the NMOS transistor mn1 exhibits a potential difference that remains between the drain-source voltage VDS approximately at the power supply voltage, and the drain-gate voltage VGD approximately at the power supply voltage. This prevents a transistor failure or life deterioration due to overstress even when a bias applied from the node OUT to the transistor exceeds its breakdown voltage.

Also in the NMOS transistor mn0 itself, the drain-source voltage VDS is near (potential of the node OUT–power supply potential), and the drain-gate voltage VGD is (potential of the node OUT–power supply potential). This prevents a transistor failure or life deterioration due to overstress even when a bias applied from the node OUT to the transistor exceeds its breakdown voltage.

In short, the PMOS transistor mp30, the PMOS transistor mp36, and the NMOS transistor mn0 serve as third to fifth transistors, respectively, according to the present invention.

In such ways, in the driver circuit 10a according to the sixth preferred embodiment, the potential of the node OUT, when higher than the power supply potential, is applied to the gate and the back gate of the PMOS transistor mp1. The PMOS transistor mp1 can therefore be cut off positively even when a signal having a potential higher than the power supply potential is input from the node OUT to the output buffer circuit.

Further in the driver circuit 10a according to the sixth preferred embodiment, the NMOS transistor mn0 is interposed between the node OUT and the NMOS transistor mn1. The NMOS transistor mn1 can therefore be cut off positively even when a signal having a potential higher than the power supply potential is input from the node OUT to the output buffer circuit.

Seventh Preferred Embodiment

In the driver circuit 10a shown in FIG. 10 according to the sixth preferred embodiment, a signal input from the node OUT is directly supplied to a capacitor included in the capacitor circuit 30. When using a capacitor not having a high breakdown voltage (the above-mentioned capacitor having the gate of a MOS transistor as one end and the other end connected to the source, the drain and the back gate of the MOS transistor, for example), a signal input from the node OUT may be supplied to the capacitor not directly but via a switch that cuts a high potential off.

Figure 13:
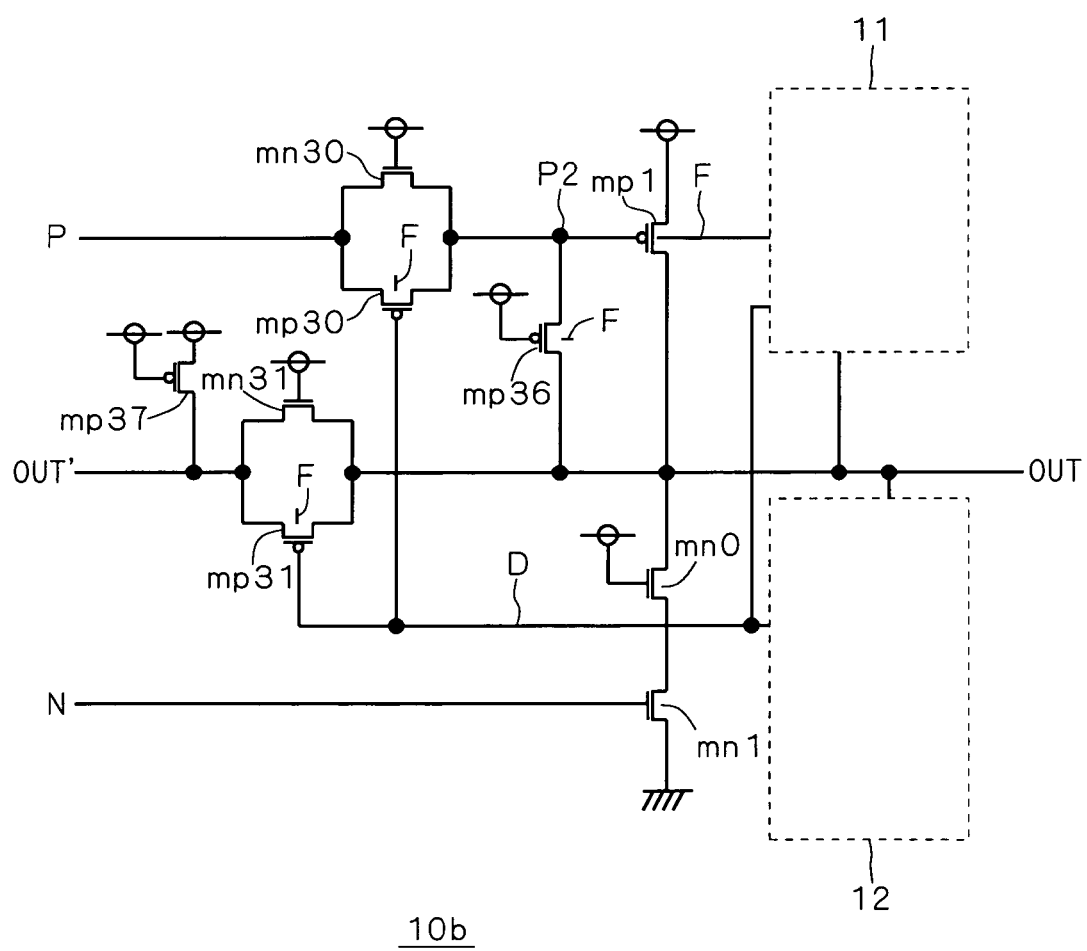
FIG. 13 shows a circuit diagram of the structure of a driver circuit according to a seventh preferred embodiment.

FIG. 13 shows a circuit diagram of the structure of a driver circuit 10b according to a seventh preferred embodiment. FIG. 13 modifies the FIG. 10 structure such that a signal input from the node OUT is supplied to a capacitor (not shown in FIG. 13) from a node OUT' via a switch including a PMOS transistor mp31 and an NMOS transistor mn31, with the node OUT' being connected to a PMOS transistor mp37.

In FIG. 13, one end of the NMOS transistor mn31 is connected at the node OUT to one end of the PMOS transistor mp31. The other end of the NMOS transistor mn31 is connected at the node OUT' to the other end of the PMOS transistor mp31, and the drain of the PMOS transistor mp37. The gate of the PMOS transistor mp31 is connected to the node D. The back gate of the PMOS transistor mp31 is connected to the node F. The gates of the PMOS transistor mp37 and the NMOS transistor mn31 are connected to the power supply potential. The source of the PMOS transistor mp37 is connected the power supply potential.

In FIG. 13, identical elements to those in FIG. 10 have the same reference numerals as those in FIG. 10, to omit detailed descriptions.

In the driver circuit 10b, when a potential applied to the node OUT exceeds the power supply potential, the nodes D and F become equal to the potentials applied to the node OUT by the potential control circuits 12 and 11, respectively. Accordingly, the PMOS transistor mp31 is cut off at this time. The NMOS transistor mn31 becomes conductive due to its gate connected to the power supply potential, but has high impedance when a drain-source voltage VDS is greater than (gate voltage VGS−NMOS threshold voltage Vthn). Accordingly, when a potential applied to the node OUT exceeds the power supply potential, with the potential of the node OUT' being the power supply potential level or less, no current flows across the node OUT' and the node OUT. When the node OUT' too has high impedance, the PMOS transistor mp37 having become conductive causes the node OUT' to be connected to the power supply potential. Namely, the PMOS transistor mp37 serves as a diode disposed between the power supply potential and the node OUT, to prevent high potential transmission from the node OUT to the node OUT' even when both of the nodes OUT and OUT' have high impedance.

In short, the PMOS transistors mp31 and mp37 serve as fifth and sixth transistors, respectively, according to the present invention.

In such ways, in the driver circuit 10b according to the seventh preferred embodiment, the node OUT' is provided between the node OUT and a capacitor included in the capacitor circuit 30, to set the potential of the node OUT' to the power supply potential when the potential of the node OUT is higher than the power supply potential. This prevents a high voltage from being applied to the capacitor even when the capacitor doe not have a high breakdown voltage.

While the invention has been shown and described in detail, the foregoing description is in all aspects illustrative and not restrictive. It is therefore understood that numerous modifications and variations can be devised without departing from the scope of the invention.

What is claimed is:

1. An output buffer circuit comprising:
    a driver circuit including a first transistor and a second transistor for outputting a driver signal to an output node, said first and second transistors being connected in series via said output node;
    a driver control circuit including:
        a first driver control circuit for controlling said first transistor based on a first input signal supplied via a first input node, and
        a second driver control circuit for controlling said second transistor based on a second input signal supplied via a second input node; and
    a capacitor circuit including:
        a first capacitor connected between said output node and a first intermediate node,
        a second capacitor connected between said first input node and said first intermediate node,
        a first gate circuit whose conduction status is controlled based on said first input signal and having a first terminal connected to said first intermediate node and a second terminal connected to a second intermediate node between said first driver control circuit and said first transistor,
        a second gate circuit whose conduction status is controlled based on said second input signal and having a first terminal connected to said first intermediate node and a second terminal connected to a third intermediate node between said second driver control circuit and said second transistor, and
        an inverter circuit connected between said first input node and said first capacitor.

2. An output buffer circuit comprising:
    a driver circuit including a first transistor and a second transistor for outputting a driver signal to an output node, said first and second transistors being connected in series via said output node;
    a driver control circuit including:
        a first driver control circuit for controlling said first transistor based on a first input signal supplied via a first input node, and
        a second driver control circuit for controlling said second transistor based on a second input signal supplied via a second input node; and
    a capacitor circuit including:
        a first capacitor connected between said output node and a first intermediate node connected between said driver control circuit and said first transistor,
        a second capacitor connected between said first input node and said first intermediate node,
        a third capacitor connected between said output node and a second intermediate node connected between said second driver control circuit and said second transistor,
        a fourth capacitor connected between said second input node and said second intermediate node, and
        an inverter circuit connected between said first input node and said first capacitor.

3. An output buffer circuit comprising:
    a driver circuit including a first transistor and a second transistor for outputting a driver signal to an output node, said first and second transistors being connected in series via said output node;
    a driver control circuit including:
        a first driver control circuit for controlling said first transistor based on a first input signal supplied via a first input node, and
        a second driver control circuit for controlling said second transistor based on a second input signal supplied via a second input node; and
    a capacitor circuit including:
        a third transistor connected between a first power supply node and a first intermediate node, whose control electrode is connected to said first input node,
        a fourth transistor connected between said first intermediate node and a second intermediate node between said first driver control circuit and said first transistor, whose control electrode is connected to said first input node,
        a first capacitor connected between said output node and said second intermediate node, a second capacitor connected between said first intermediate node and said output node,
a fifth transistor connected between a second power supply node and a third intermediate node, whose control electrode is connected to said second input node,
a sixth transistor connected between said third intermediate node and a fourth intermediate node between said second driver control circuit and said second transistor, whose control electrode is connected to said second input node,
a third capacitor connected between said output node and said third intermediate node,
a fourth capacitor connected between said output node and said fourth intermediate node, and
an inverter circuit connected between said first input node and said control electrodes of said third and fourth transistors.

4. An output buffer circuit comprising:
a driver circuit including a first transistor and a second transistor for outputting a driver signal to an output node, said first and second transistors being connected in series via said output node;
a driver control circuit including:
  a first driver control circuit for controlling said first transistor based on a first input signal supplied via a first input node, and
  a second driver control circuit for controlling said second transistor based on a second input signal supplied via a second input node; and
a capacitor circuit including:
  a third transistor connected between said output node and a first intermediate node, whose control electrode is connected to said first input node,
  a fourth transistor connected between said first intermediate node and a second intermediate node between said first driver control circuit and said first transistor, whose control electrode is connected to said first input node,
  a first capacitor connected between said output node and said second intermediate node,
  a second capacitor connected between said first intermediate node and said output node,
  a fifth transistor connected between said output node and a third intermediate node, whose control electrode is connected to said second input node,
  a sixth transistor connected between said third intermediate node and a fourth intermediate node between said second driver control circuit and said second transistor, whose control electrode is connected to said second input node,
  a third capacitor connected between said output node and said third intermediate node,
  a fourth capacitor connected between said output node and said fourth intermediate node, and
  an inverter circuit connected between said first input node and said control electrodes of said third and fourth transistors.

5. An output buffer circuit comprising:
a driver circuit including a first transistor and a second transistor for outputting a driver signal to an output node, said first and second transistors being coupled in series via said output node;
a driver control circuit for controlling said first and second transistors based on a control signal; and
a first capacitor circuit including a first group of capacitors interposed between said output node and a control electrode of said first transistor, wherein
said first group of capacitors includes:
a first capacitor coupled between said output node and said control electrode of said first transistor; and
a second capacitor coupled between said output node and a first intermediate node, which is selectively coupled to said control electrode of said first transistor or a first power supply node by a change in applied voltage in accordance with said control signal;
a second capacitor circuit including a second group of capacitors interposed between said output node and a control electrode of said second transistor, wherein
said second group of capacitors includes:
a third capacitor connected between said output node and said control electrode of said second transistor; and
a fourth capacitor coupled between said output node and a second intermediate node, which is selectively coupled to said control electrode of said second transistor or a second power supply node by a change in applied voltage in accordance with said control signal.

6. An output buffer circuit comprising:
a driver circuit including a first transistor and a second transistor for outputting a driver signal to an output node, said first and second transistors being coupled in series via said output node;
a driver control circuit for controlling said first and second transistors based on a control signal; and
a first capacitor circuit including a first group of capacitors interposed between said output node and a control electrode of said first transistor, wherein
said first group of capacitors includes:
a first capacitor coupled between said output node and said control electrode of said first transistor; and
a second capacitor coupled between said output node and a first intermediate node, which is selectively coupled to said control electrode of said first transistor or said output node by a change in applied voltage in accordance with said control signal;
a second capacitor circuit including a second group of capacitors interposed between said output node and a control electrode of said second transistor, wherein
said second group of capacitors includes:
a third capacitor connected between said output node and said control electrode of said second transistor; and
a fourth capacitor coupled between said output node and a second intermediate node, which is selectively coupled to said control electrode of said second transistor or said output node by a change in applied voltage in accordance with said control signal.

* * * * *